United States Patent
Yamazaki et al.

(10) Patent No.: US 9,207,511 B2
(45) Date of Patent: Dec. 8, 2015

(54) LIQUID CRYSTAL DISPLAY DEVICE, DRIVING METHOD OF THE SAME, AND ELECTRONIC APPLIANCE INCLUDING THE SAME

(75) Inventors: Shunpei Yamazaki, Setagaya (JP); Jun Koyama, Sagamihara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 713 days.

(21) Appl. No.: 12/912,070

(22) Filed: Oct. 26, 2010

(65) Prior Publication Data

US 2011/0102696 A1    May 5, 2011

(30) Foreign Application Priority Data

Oct. 30, 2009  (JP) ................. 2009-250517
Dec. 8, 2009   (JP) ................. 2009-279000

(51) Int. Cl.
*G02F 1/1335*  (2006.01)
*G02F 1/1368*  (2006.01)
*G02F 1/1345*  (2006.01)
*H01L 27/12*   (2006.01)

(52) U.S. Cl.
CPC .......... *G02F 1/1368* (2013.01); *G02F 1/13458* (2013.01); *H01L 27/1225* (2013.01)

(58) Field of Classification Search
CPC .............. G02F 1/1368; G02F 1/13458; H01L 27/1225
USPC .................................. 349/149–153
See application file for complete search history.

(56) References Cited

U.S. PATENT DOCUMENTS

| | | | |
|---|---|---|---|
| 5,731,856 | A | 3/1998 | Kim et al. |
| 5,744,864 | A | 4/1998 | Cillessen et al. |
| 5,982,471 | A | 11/1999 | Hirakata et al. |
| 6,294,274 | B1 | 9/2001 | Kawazoe et al. |
| 6,563,174 | B2 | 5/2003 | Kawasaki et al. |
| 6,727,522 | B1 | 4/2004 | Kawasaki et al. |
| 6,798,476 | B2 | 9/2004 | Hanakawa et al. |

(Continued)

FOREIGN PATENT DOCUMENTS

| | | |
|---|---|---|
| CN | 101401213 A | 4/2009 |
| CN | 101425280 A | 5/2009 |

(Continued)

OTHER PUBLICATIONS

International Search Report (Application No. PCT/JP2010/067323) Dated Dec. 14, 2010.

(Continued)

*Primary Examiner* — Charles Chang
(74) *Attorney, Agent, or Firm* — Eric J. Robinson; Robinson Intellectual Property Law Office, P.C.

(57) ABSTRACT

An object is to provide a liquid crystal display device in which low power consumption can be achieved. A first substrate includes a terminal portion, a switching transistor, and a pixel circuit including a pixel electrode is provided. A second substrate includes a counter electrode. A liquid crystal element is interposed between the pixel electrode and the counter electrode. A potential to be input to the counter electrode is supplied from a terminal portion through the switching transistor. A semiconductor layer included in the switching transistor is an oxide semiconductor layer.

33 Claims, 16 Drawing Sheets

(56) References Cited

U.S. PATENT DOCUMENTS

| | | | |
|---|---|---|---|
| 6,831,717 B2 | 12/2004 | Hanakawa et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,105,868 B2 | 9/2006 | Nause et al. | |
| 7,211,825 B2 | 5/2007 | Shih et al | |
| 7,282,782 B2 | 10/2007 | Hoffman et al. | |
| 7,286,108 B2 | 10/2007 | Tsuda et al. | |
| 7,297,977 B2 | 11/2007 | Hoffman et al. | |
| 7,321,353 B2 | 1/2008 | Tsuda et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,501,293 B2 | 3/2009 | Ito et al. | |
| 7,674,650 B2 | 3/2010 | Akimoto et al. | |
| 7,732,819 B2 | 6/2010 | Akimoto et al. | |
| 7,791,072 B2 | 9/2010 | Kumomi et al. | |
| 7,791,074 B2 | 9/2010 | Iwasaki | |
| 7,889,308 B2 | 2/2011 | Jeong | |
| 7,906,777 B2 | 3/2011 | Yano et al. | |
| 7,935,582 B2 | 5/2011 | Iwasaki | |
| 7,956,361 B2 | 6/2011 | Iwasaki | |
| 7,998,372 B2 | 8/2011 | Yano et al. | |
| 8,003,981 B2 | 8/2011 | Iwasaki et al. | |
| 8,139,011 B2 * | 3/2012 | Ishii | 345/94 |
| 8,154,024 B2 | 4/2012 | Iwasaki | |
| 8,373,840 B2 | 2/2013 | Jeong | |
| 2001/0046027 A1 | 11/2001 | Tai et al. | |
| 2002/0056838 A1 | 5/2002 | Ogawa | |
| 2002/0132454 A1 | 9/2002 | Ohtsu et al. | |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0127038 A1 | 7/2004 | Carcia et al. | |
| 2005/0017302 A1 | 1/2005 | Hoffman | |
| 2005/0199959 A1 | 9/2005 | Chiang et al. | |
| 2006/0035452 A1 | 2/2006 | Carcia et al. | |
| 2006/0043377 A1 | 3/2006 | Hoffman et al. | |
| 2006/0091793 A1 | 5/2006 | Baude et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0244892 A1 * | 11/2006 | Asai et al. | 349/151 |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0030434 A1 * | 2/2007 | Hirabayashi et al. | 349/149 |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0115219 A1 | 5/2007 | Inoue | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0050595 A1 | 2/2008 | Nakagawara et al. | |
| 2008/0055218 A1 | 3/2008 | Tsuda et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0284933 A1 * | 11/2008 | Ito et al. | 349/43 |
| 2008/0284970 A1 | 11/2008 | Ishitani | |
| 2008/0296568 A1 | 12/2008 | Ryu et al. | |
| 2009/0057674 A1 * | 3/2009 | Jeong et al. | 257/59 |
| 2009/0065771 A1 | 3/2009 | Iwasaki et al. | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0237002 A1 | 9/2009 | Inoue | |
| 2009/0261325 A1 | 10/2009 | Kawamura et al. | |
| 2009/0278122 A1 | 11/2009 | Hosono et al. | |
| 2009/0280600 A1 | 11/2009 | Hosono et al. | |
| 2010/0045912 A1 * | 2/2010 | Chen et al. | 349/122 |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2011/0090183 A1 | 4/2011 | Yamazaki et al. | |
| 2011/0115839 A1 | 5/2011 | Takahashi et al. | |
| 2011/0256684 A1 | 10/2011 | Iwasaki et al. | |

FOREIGN PATENT DOCUMENTS

| | | |
|---|---|---|
| EP | 1158345 A | 11/2001 |
| EP | 1737044 A | 12/2006 |
| EP | 2226847 A | 9/2010 |
| EP | 2339639 A | 6/2011 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-224626 | 9/1993 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2001-282206 A | 10/2001 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2003-344823 | 12/2003 |
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2007-103918 A | 4/2007 |
| JP | 2007-142195 A | 6/2007 |
| JP | 2007-142196 A | 6/2007 |
| JP | 2007-250983 | 9/2007 |
| JP | 2009-212443 | 9/2009 |

(56) References Cited

FOREIGN PATENT DOCUMENTS

| | | |
|---|---|---|
| JP | 2009-224479 A | 10/2009 |
| TW | 1232989 | 5/2005 |
| TW | 200801744 | 1/2008 |
| WO | WO-2004/114391 | 12/2004 |
| WO | WO-2007/029844 | 3/2007 |
| WO | WO-2007/119386 | 10/2007 |
| WO | WO-2009/110623 | 9/2009 |

OTHER PUBLICATIONS

Written Opinion (Application No. PCT/JP2010/067323) Dated Dec. 14, 2010.

Fortunato.E et al., "Wide-Bandgap High-Mobility ZnO Thin-Film Transistors Produced at Room Temperature,", Appl. Phys. Lett. (Applied Physics Letters), Sep. 27, 2004, vol. 85, No. 13, pp. 2541-2543.

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using Cg-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350° C.,", Journal of Solid State Chemistry, Aug. 1, 1991, vol. 93, No. 2, pp. 298-315.

Kimizuka.N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA Amoled Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-Plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

(56) References Cited

OTHER PUBLICATIONS

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In-Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilcon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of The 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N et al., "Spinel,YBFE2O4, and YB2FE3O7 Types of Structures for Compounds in the In2O3 and SC2O3-A2O3-BO Systems [A; Fe, Ga, or Al; B: Mg, Mn, Fe, Ni, Cu,or Zn] at Temperatures Over 1000° C.,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", JPN. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

Ueno.K et al., "Field-Effect Transistor on SrTiO3 With Sputtered Al2O3 Gate Insulator,", Appl. Phys. Lett. (Applied Physics Letters) , Sep. 1, 2003, vol. 83, No. 9, pp. 1755-1757.

Chinese Office Action (Application No. 201080043022.6) Dated May 5, 2014.

Taiwanese Office Action (Application No. 099136712) Dated Jun. 23, 2015.

* cited by examiner

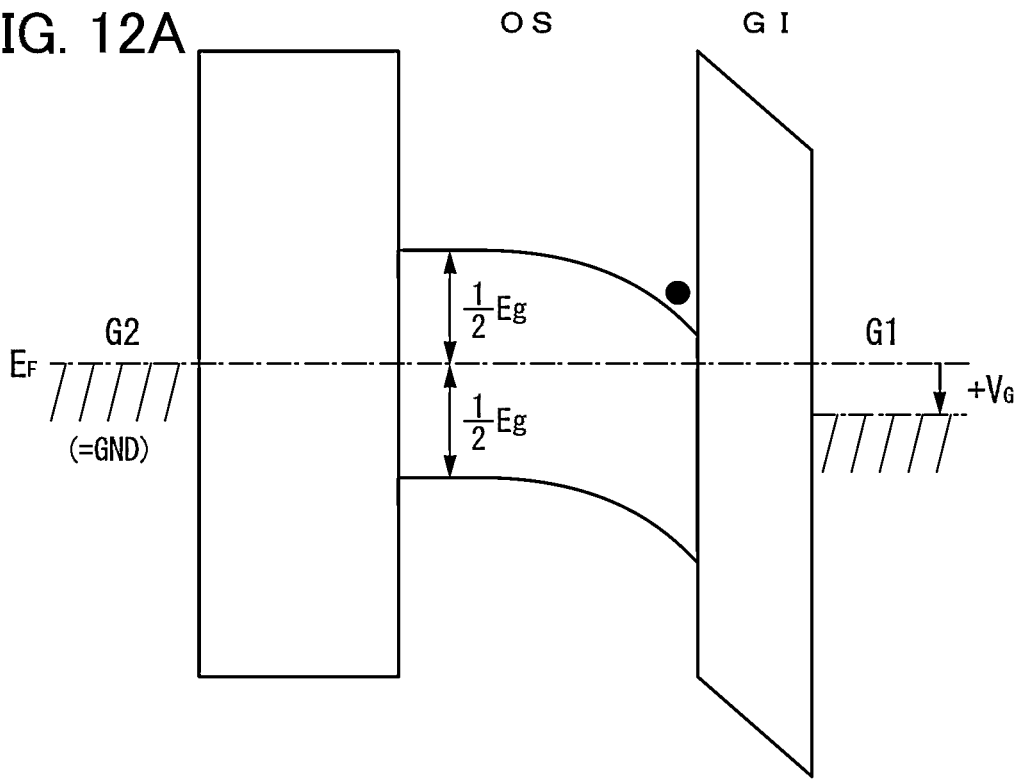
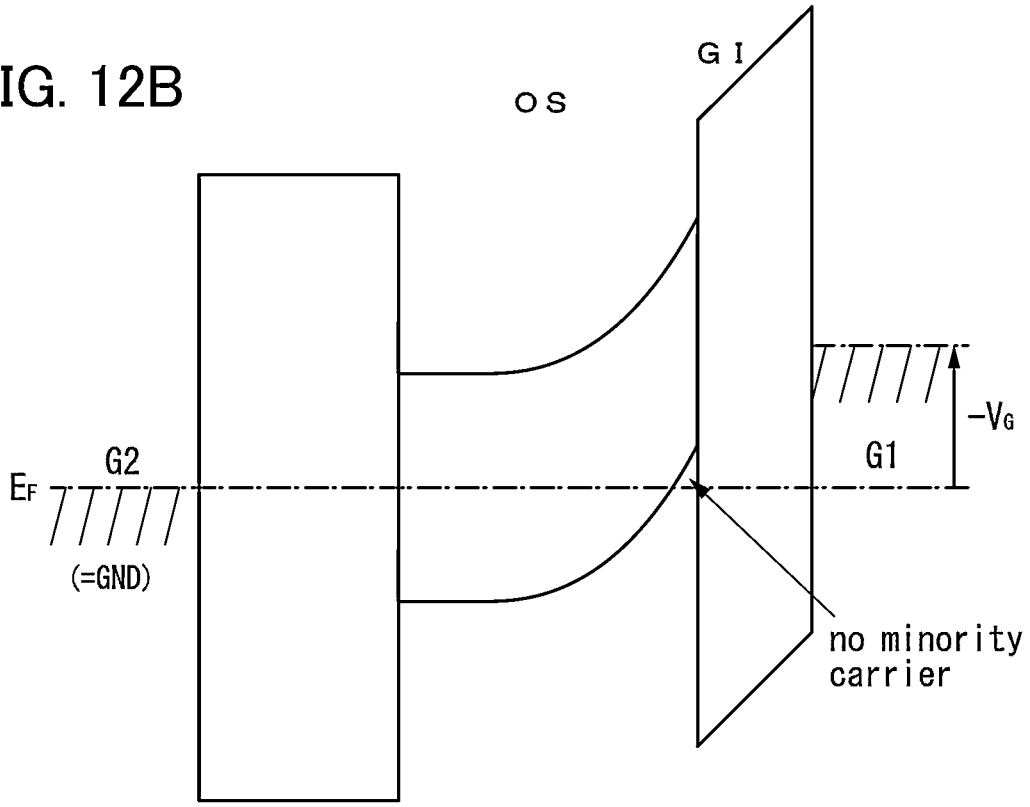

LIQUID CRYSTAL DISPLAY DEVICE, DRIVING METHOD OF THE SAME, AND ELECTRONIC APPLIANCE INCLUDING THE SAME

TECHNICAL FIELD

The present invention relates to a liquid crystal display device. Further, the present invention relates to a driving method of the liquid crystal display device. Furthermore, the present invention relates to an electronic appliance including the liquid crystal display device.

BACKGROUND ART

A thin film transistor formed over a flat plate such as a glass substrate is manufactured using amorphous silicon or polycrystalline silicon, as typically seen in a liquid crystal display device. A thin film transistor manufactured using amorphous silicon has low field effect mobility, but can be formed over a larger glass substrate. In contrast, a thin film transistor manufactured using a crystalline silicon has high field effect mobility, but due to a crystallization step such as laser annealing, such a transistor is not always suitable for being formed over a larger glass substrate.

In view of the foregoing, attention has been drawn to a technique by which a thin film transistor is manufactured using an oxide semiconductor, and such a transistor is applied to an electronic device or an optical device. For example, Patent Document 1 discloses a technique by which a thin film transistor is manufactured using zinc oxide or an In—Ga—Zn—O-based oxide semiconductor for an oxide semiconductor film and such a transistor is used as a switching element or the like of a liquid crystal display device.

REFERENCE

Patent Document

[Patent Document 1] Japanese Published Patent Application No. 2006-165528

DISCLOSURE OF INVENTION

The field effect mobility of a thin film transistor in which an oxide semiconductor is used for a channel region is higher than that of a thin film transistor in which amorphous silicon is used for a channel region. A pixel including such a thin film transistor formed using an oxide semiconductor is expected to be applied to a display device such as a liquid crystal display device.

Each pixel in a liquid crystal display device is provided with a storage capacitor which holds potentials of electrodes in two terminals interposing a liquid crystal material for a predetermined period. In order to hold the potentials of the electrodes in the two terminals interposing the liquid crystal material, it is necessary to reduce the leakage of electric charges of the electrodes in the two terminals interposing the liquid crystal material. Thus, it is important to reduce off-state current of a thin film transistor connected to a pixel electrode in each pixel. When the off-state current of a thin film transistor is reduced, the voltage holding period of the pixel can be extended. Therefore, it is important to reduce off-state current in achieving low power consumption at the time of displaying a still image or the like.

Note that in this specification, off-state current is current which flows between a source and a drain when a thin film transistor is in an off state (also called a non-conductive state). In the case of an n-channel thin film transistor (for example, with a threshold voltage of about 0 to 2 V), the off-state current means a current which flows between a source and a drain when a negative voltage is applied between a gate and the source.

A pair of electrodes interposing the liquid crystal material includes a counter electrode as well as the pixel electrode. When the leakage of electric charges is reduced also on the counter electrode side, the voltage holding period of the pixel can be extended. It is important to reduce the leakage of electric charges also on the counter electrode side and to extend the voltage holding period in achieving low power consumption at the time of displaying a still image or the like.

An object of an embodiment of the present invention is to provide a liquid crystal display device in which, in order to reduce the leakage of electric charges from electrodes interposing a liquid crystal material, off-state current of a thin film transistor can be reduced, so that low power consumption can be achieved, and a driving method of the liquid crystal display device.

The following is the gist: a liquid crystal display device in which a liquid crystal element is interposed between a pixel electrode over a first substrate and a counter electrode on a second substrate is provided, where a common potential to be supplied to the counter electrode is input from a terminal portion of the first substrate through a switching transistor including a semiconductor layer formed using an oxide semiconductor.

An embodiment of the present invention is a liquid crystal display device including a first substrate provided with a terminal portion, a switching transistor, and a pixel circuit including a pixel having a pixel transistor and a pixel electrode electrically connected to the pixel transistor; a second substrate provided with a counter electrode; and a liquid crystal interposed between the pixel electrode and the counter electrode. In the liquid crystal display device, the counter electrode is electrically connected to the terminal portion through the switching transistor, and the pixel transistor and the switching transistor each include an oxide semiconductor layer.

According to an embodiment of the present invention, a gate line driver circuit and a signal line driver circuit may be provided over the first substrate in the liquid crystal display device.

According to an embodiment of the present invention, a hydrogen concentration of the oxide semiconductor layer in the liquid crystal display device may be $1 \times 10^{16}/cm^3$ or less which is measured by secondary ion mass spectrometry.

According to an embodiment of the present invention, a carrier concentration of the oxide semiconductor layer in the liquid crystal display device may be less than $1 \times 10^{14}/cm^3$.

An embodiment of the present invention is a driving method of a liquid crystal display device including a first substrate provided with a terminal portion, a switching transistor having an oxide semiconductor layer, and a pixel circuit including a pixel having a pixel transistor having an oxide semiconductor layer and a pixel electrode electrically connected to the pixel transistor; a second substrate provided with a counter electrode electrically connected to the terminal portion through the switching transistor; and a liquid crystal interposed between the pixel electrode and the counter electrode. The driving method includes the steps of, in a period where a moving image is displayed, making a first terminal of the switching transistor and a second terminal of the switching transistor into a conduction state so as to supply a common potential to the counter electrode; and, in a period where a still image is displayed, making the first terminal of the switching transistor and the second terminal of the switching transistor into a non-conduction state so as to make the counter electrode into an electrically floating state.

According to an embodiment of the present invention, the driving method may further include the steps of supplying a first signal for driving the pixel transistor from the gate line driver circuit to the pixel transistor and a second signal from the signal line driver circuit to the pixel transistor in the period where the moving image is displayed; and stopping the first signal and the second signal in the period where the still image is displayed.

According to an embodiment of the present invention, the driving method of a liquid crystal display device may be a method in which a conduction state or a non-conduction state between the counter electrode and the terminal portion to which the common potential is supplied is controlled by the switching transistor in accordance with a signal supplied from the terminal portion to a gate terminal of the switching transistor.

With an embodiment of the present invention, a liquid crystal display device which can achieve low power consumption by reducing off-state current of a thin film transistor can be provided.

BRIEF DESCRIPTION OF DRAWINGS

FIGS. 12A and 12B are diagrams for illustrating Embodiment 7.

BEST MODE FOR CARRYING OUT THE INVENTION

Figure 1A:
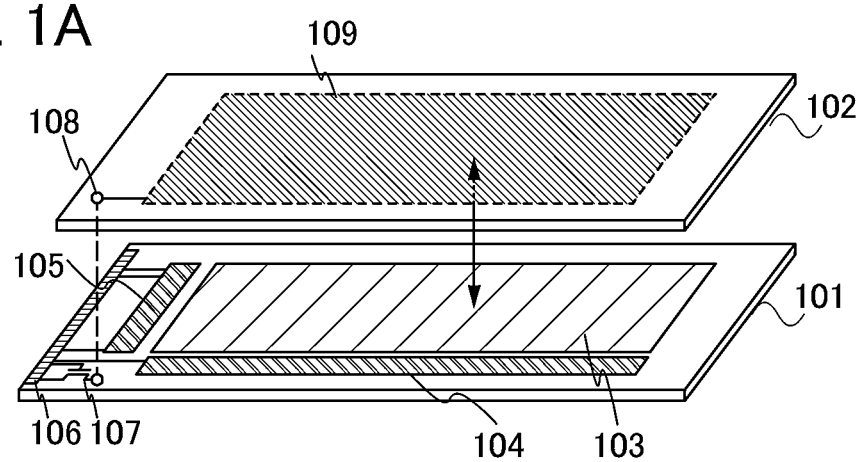
FIGS. 1A to 1C illustrate a liquid crystal display device of Embodiment 1.

Hereinafter, embodiments of the present invention will be described with reference to drawings. However, the present invention can be carried out in many different modes, and it is easily understood by those skilled in the art that modes and details of the present invention can be modified in various ways without departing from the purpose and the scope of the present invention. Therefore, this invention is not interpreted as being limited to the description of the embodiments. Note that identical portions or portions having the same function in the structure of the present invention that is described below are denoted by the same reference numerals.

Note that the size, the thickness of a layer, or a region of each structure illustrated in drawings or the like in embodiments is exaggerated for simplicity in some cases. Therefore, embodiments of the present invention are not necessarily limited to such scales.

Note that terms such as first, second, third to Nth (N is a natural number) seen in this specification are used in order to avoid confusion between components and do not set a limitation on number.

(Embodiment 1)

In this embodiment, a schematic view, circuit diagrams, a timing chart, and the like of a liquid crystal display device are described, and an effect of a structure of this embodiment is described. First, a schematic view of a liquid crystal display device is described with reference to FIG. 1A.

A liquid crystal display device includes a first substrate 101 and a second substrate 102 as illustrated in FIG. 1A. The first substrate 101 includes a pixel circuit 103, a gate line driver circuit 104, a signal line driver circuit 105, a terminal portion 106, and a switching transistor 107. The second substrate 102 includes a common connection portion 108 (also referred to as a common contact) and a counter electrode 109.

It is necessary that the first substrate 101 and the second substrate 102 have enough heat resistance to withstand heat treatment to be performed later. Further, it is necessary that at least one of the first substrate and the second substrate have a light-transmitting property. As the first substrate and the second substrate, a glass substrate used for electronics industry (also called a "non-alkali glass substrate") such as an aluminosilicate glass substrate, an aluminoborosilicate glass substrate, or a barium borosilicate glass substrate; a quartz substrate; a ceramic substrate; a plastic substrate; or the like can be used.

Figure 2:
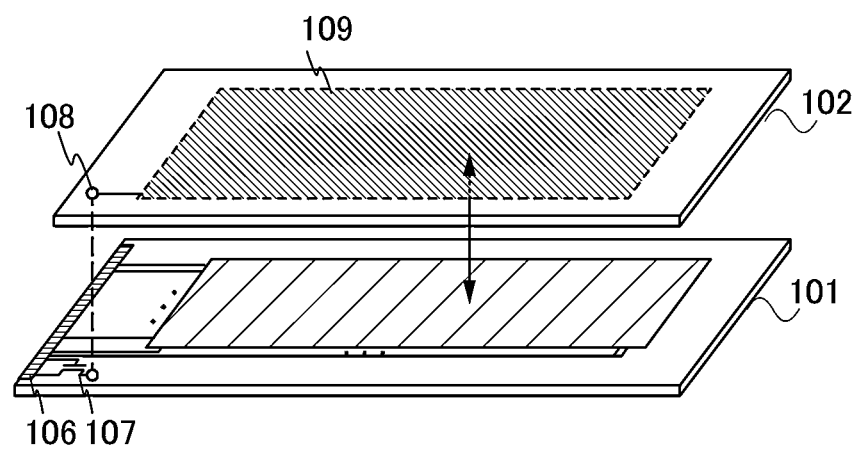
FIG. 2 illustrates a liquid crystal display device of Embodiment 1.

Note that the pixel circuit 103, the gate line driver circuit 104, the signal line driver circuit 105, and the switching transistor 107 in FIG. 1A are formed using thin film transistors formed over the first substrate 101. Note that the gate line driver circuit 104 and the signal line driver circuit 105 in FIG. 1A are not necessarily formed using thin film transistors formed over the first substrate 101 and may be formed over another substrate outside the first substrate 101, or the like. As illustrated in FIG. 2 as an example, signals for image display may be input to the pixel circuit 103 through wirings extended from the terminal portion 106.

Note that in the pixel circuit 103, a plurality of gate lines and a plurality of signal lines are extended from the gate line driver circuit 104 and the signal line driver circuit 105, and a plurality of pixels is provided so that the pixels are surrounded by the gate lines and the signal lines. An image signal to be supplied to pixel electrodes of the pixels is supplied to the plurality of signal lines. With the plurality of gate lines, pixel transistors are controlled so that the image signal supplied from the signal lines is selected and supplied to the pixel electrodes of the pixels. The gate line driver circuit 104 is a circuit for generating and outputting signals to be supplied to the gate lines, and the signal line driver circuit 105 is a circuit for generating and outputting a signal to be supplied to the signal lines.

Note that as a display method of an image in the pixel circuit 103, a progressive method, an interlace method, or the like can be employed. Color components controlled in the pixel at the time of color display are not limited to three colors of R, G, and B (R, G, and B correspond to red, greed, and blue, respectively); for example, R, G, B, and W (W corresponds to white), or R, G, B, and one or more of yellow, cyan, magenta, and the like can be employed. Further, the sizes of display regions may be different between respective dots of color elements. However, an embodiment of the present invention is not limited to a liquid crystal display device for color display and is applicable to a liquid crystal display device for monochrome display.

Note that a switching transistor in this specification is a thin film transistor in which conduction or non-conduction between two terminals, i.e., a source terminal and a drain terminal, is selected in accordance with a potential applied to a gate to realize switching operation. For example, a potential to be applied to the gate of the thin film transistor may be controlled such that the thin film transistor operates in a linear region. Note that the potential to be applied to a gate of the switching transistor 107 may be supplied from the terminal portion 106. One of the source terminal and the drain terminal of the switching transistor 107, which is connected to the terminal portion 106, is referred to as a first terminal. The other of the source terminal and the drain terminal of the switching transistor 107, which is connected to a counter electrode through the common connection portion 108, is referred to as a second terminal. Note that a common potential of the counter electrode 109 is supplied from the first terminal of the switching transistor 107, and a signal for controlling conduction or non-conduction of the switching transistor 107 is supplied to the gate terminal.

Note that the switching transistor may have any of the following structures: either an inverted staggered structure or a staggered structure; a double-gate structure in which a channel region is divided into a plurality of regions and the divided channel regions are connected in series; or a dual-gate structure in which gate electrodes are provided over and under the channel region. Further, a transistor element in which a semiconductor layer forming the switching transistor is divided into a plurality of island-like semiconductor layers to realize switching operation may be used.

Further, the following signals and potentials are supplied to the terminal portion 106: a signal for controlling a pulse signal output from the gate line driver circuit 104 and the signal line driver circuit 105, such as a start pulse SP and a clock signal; the image signal (also referred to as a video voltage, a video signal, or video data); a high power supply potential $V_{dd}$ and a low power supply potential $V_{ss}$ as power supply potentials; the common potential to be supplied to the counter electrode 109; a signal for operating the switching transistor 107; and the like.

Note that the high power supply potential $V_{dd}$ is a potential higher than a reference potential, and the low power supply potential $V_{ss}$ is a potential lower than or equal to the reference potential. Note that it is desirable that each of the high power supply potential and the low power supply potential be a potential such that a transistor can operate.

Note that a voltage refers to a potential difference between a given potential and a reference potential (e.g., a ground potential) in many cases. Accordingly, a voltage, a potential, and a potential difference can be referred to as a potential, a voltage, and a voltage difference, respectively.

The common potential may be any potential as long as it serves as reference with respect to a potential of an image signal supplied to a pixel electrode. For example, the common potential may be a ground potential.

The common connection portion 108 is provided for achieving electrical connection between the second terminal of the switching transistor 107 in the first substrate 101 and the counter electrode in the second substrate 102. The common potential is supplied from the terminal portion 106 to the counter electrode through the switching transistor 107 and the common connection portion 108. As a specific example of the common connection portion 108, a conductive particle in which an insulating sphere is coated with a thin metal film may be used, so that electrical connection is made. Note that two or more common connection portions 108 may be provided between the first substrate 101 and the second substrate 102.

It is preferable that the counter electrode 109 overlap with the pixel electrode included in the pixel circuit 103. Further, the counter electrode 109 and the pixel electrode included in the pixel circuit 103 may have a variety of opening patterns.

In the case where the pixel circuit 103, the gate line driver circuit 104, the signal line driver circuit 105, and the switching transistor 107 are formed over the first substrate 101 or the case where the pixel circuit 103 and the switching transistor 107 are formed over the first substrate 101, each circuit element is formed using an n-channel thin film transistor having a semiconductor layer formed using an oxide semiconductor.

Next, in the structure of this embodiment, an oxide semiconductor layer used for the semiconductor layer of the thin film transistor is described.

As for the oxide semiconductor used in this embodiment, hydrogen is contained at $1 \times 10^{16}/\text{cm}^3$ or less in the oxide semiconductor, and hydrogen contained in the oxide semiconductor is removed as close to zero as possible. An oxide semiconductor film has a carrier concentration which is less than $1 \times 10^{14}/\text{cm}^3$, preferably less than or equal to $1 \times 10^{11}/\text{cm}^3$, and is used to form a channel region of a thin film transistor. In this specification, the concentration of hydrogen in the oxide semiconductor layer is measured by secondary ion mass spectrometry (SIMS).

The energy gap of the oxide semiconductor layer is set to be 2 eV or more, preferably 2.5 eV or more, still preferably 3 eV or more, and impurities such as hydrogen which form part of donors are reduced as much as possible so that the carrier concentration is less than $1 \times 10^{14}/\text{cm}^3$, preferably less than or equal to $1 \times 10^{12}/\text{cm}^3$. That is, the carrier concentration of the oxide semiconductor layer is reduced as much as possible to be extremely close to zero.

Such an oxide semiconductor which is highly purified by removing impurities such as hydrogen from the oxide semiconductor layer as much as possible is used for a channel formation region of the thin film transistor, whereby the drain current can be less than or equal to $1 \times 10^{-13}$ A at drain voltages of 1 V and 10 V and a gate voltage in the range of −5 V to −20 V even when the channel width is 10 mm In the case where a switching element or the like is manufactured using such a thin film transistor the off-state current of which is extremely small, off-state current is small and the leakage hardly occurs; therefore, the leakage of electric charges at a node connected to the switching element can be reduced as much as possible. Thus, a period for holding a potential at the node can be extended.

As for a thin film transistor including the above-described oxide semiconductor layer, the off-state current per micrometer of the channel width can be less than or equal to 10 aA/μm ($1 \times 10^{-17}$ A/μm), and further can be less than or equal to 1 aA/μm ($1 \times 10^{-18}$ A/μm). On the other hand, the design or the like of a thin film transistor including low-temperature polysilicon is made on the assumption that the off-state current of the thin film transistor is approximately $1 \times 10^{-12}$ A. Therefore, when a thin film transistor including an oxide semiconductor is used, a potential holding period can be 10000 times as long as that of a potential at the time of using a thin film transistor including a low-temperature polysilicon. As for a thin film transistor including amorphous silicon, the off-state current per micrometer of the channel width is $1 \times 10^{-13}$ A/μm or more. Therefore, in the case of a pixel including a transistor having a highly purified oxide semiconductor, which has a storage capacitance (about 0.1 pF) equal to that of a pixel including a transistor having amorphous silicon, the voltage holding period can be $10^4$ times or more as long as that of the pixel including the thin film transistor having amorphous silicon.

Specifically, since the period for holding the image signal in each pixel can be extended in the case of using a thin film transistor including an oxide semiconductor layer, an interval between writing timings for displaying a still image can be 10 seconds or longer, preferably 30 seconds or longer, still preferably one minute or longer and shorter than ten minutes. That is, the extension of the holding period can reduce the frequency of supplying of the image signal and the common potential to the pixel electrode and the counter electrode, particularly when a still image is displayed. Therefore, low power consumption can be achieved.

Note that in still image display, refresh operation may be performed as appropriate considering a holding rate of a voltage applied to a liquid crystal element during a holding period. For example, refresh operation may be performed at the timing when a voltage is decreased to a predetermined level with respect to the value of voltage (initial value) shortly after a signal is written to a pixel electrode of a liquid crystal element. The predetermined level is preferably set to a voltage at which flicker is not sensed with respect to the initial value. Specifically, in the case where a display object is an image, refresh operation (rewrite) is preferably performed every time the voltage becomes 1.0%, preferably 0.3%, lower than the initial value. In the case where a display object is text, refresh operation (rewrite) is preferably performed every time the voltage becomes 10%, preferably 3%, lower than the initial value.

For example, in the case of a pixel including the transistor formed using low-temperature polysilicon, image display is generally performed at 60 frames per second (for 16 msec per frame). The same can be applied to the case of still-image display, and this is because if the rate is decreased (the interval between writing timings is increased), the voltage of the pixel is decreased, which adversely affects the image display. On the other hand, in the case of using the above-described transistor including the oxide semiconductor layer, the holding period per signal writing can be extended to 160 seconds which is about $10^4$ times as long as that of the transistor formed using low-temperature polysilicon since the off-state current is small.

In this manner, still image display can be performed on a display portion even by less frequent writing of the image signal. Since the holding period can be extended, the frequency of signal writing can be decreased particularly when a still image is displayed. For example, the number of times of signal writing in a display period of one still image can be one or n (n is greater than or equal to 2 and less than or equal to $10^3$). Thus, low power consumption of a display device can be achieved.

The resistance to flow of off-state current in a transistor can be represented to as the off-state resistivity. The off-state resistivity is the resistivity of a channel formation region when the transistor is off, which can be calculated from the off-state current.

Specifically, the resistance when the transistor is off (off-state resistance R) can be calculated using Ohm's law from the off-state current and the drain voltage, which leads to the off-state resistivity ρ which can be calculated using Formula, ρ=RA/L (R is the off-state resistance), from the cross-sectional area A of the channel formation region and the length L of the channel formation region (which corresponds to the distance between a source electrode and a drain electrode).

The cross-sectional area A can be calculated from A=dW where the thickness of the channel formation region is d and the channel width is W. The length L of the channel formation region is the channel length L. In this manner, the off-state resistivity can be calculated from the off-state current.

The off-state resistivity of the transistor including the oxide semiconductor layer in this embodiment is preferably $1\times10^9$ Ω·m or more, far preferably $1\times10^{10}$ Ω·m or more.

Note that in the case of a liquid crystal display device in which display is performed by switching a still image and a moving image, supplying and stop of the signal for controlling the pulse signal output from the gate line driver circuit 104 and the signal line driver circuit 105 are repeatedly switched. Thus, low power consumption can be achieved.

The moving image refers to an image which is recognized as a moving image with human eyes by rapid switch of a plurality of images which are time-divided into a plurality of frames. Specifically, the moving image refers to a series of image signals which are recognized as a moving image with less flicker with human eyes by switching images at least 60 times (60 frames) per second. The still image refers to image signals which do not change in a series of frame periods, for example, in the n-th frame and (n+1)-th frame, unlike the moving image, though a plurality of images which are time-divided into a plurality of frame periods are switched rapidly.

Note that in the case of a liquid crystal display device in which display is performed by switching a still image and a moving image, whether an image is a moving image or a still image may be determined by comparison between images in frames which is performed in another substrate or the like. For example, a memory circuit and a comparison circuit may be provided, so that image signals in a series of frame periods may be selectively read out from the memory circuit which is separately provided in order to store image signals for frames, and the image signals may be compared by the comparison circuit. Further, a circuit for determining an image to be a moving image when a difference is detected by the comparison and determining an image to be a still image when a difference is not detected by the comparison may be provided. Specifically, when an image is determined to be a moving image by the comparison circuit, that is, when a difference of image signals in a series of frames is detected, the image signals and the common potential are supplied to the pixels in the pixel circuit 103 and the counter electrode. On the other hand, when an image is determined to be a still image by the comparison circuit, that is, a difference of image signals in a series of frames is not detected, the stop of the image signals and the common potential to the pixels of the pixel circuit 103 and the counter electrode is performed. In the case where an image is determined to be a still image, the stop of the image signals is performed, and in addition, the stop of power supply potentials such as the high power supply potential $V_{dd}$ and the low power supply potential $V_{ss}$ is performed. Thus, low power consumption can be further achieved.

The supplying of image signals, power supply potentials, and a common potential refers to supplying of a predetermined potential to a wiring. The stop of a power supply potential refers to stop of supplying of the predetermined potential to the wiring, and connection to a wiring to which a predetermined fixed potential is supplied, for example, a wiring to which the low power supply potential $V_{ss}$ is supplied. The stop of image signals and a common potential also refers to cut of an electrical connection to a wiring to which a predetermined potential is supplied, to bring the wiring into an electrically floating state.

It is preferable that the stop of the image signals and the common potential be performed entirely in the period for holding an image signal in each pixel in the pixel circuit 103, and the image signals and the common potential be supplied again after the holding period of each pixel.

Figure 1B:
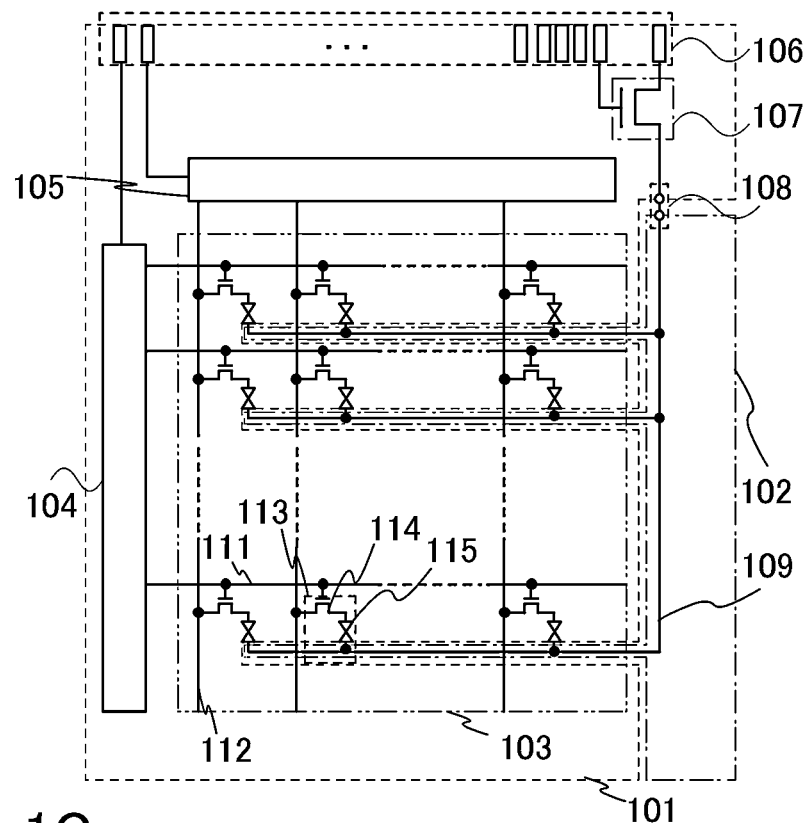

FIG. 1B is a circuit diagram of the schematic view of the liquid crystal display device of FIG. 1A, in which the structure of the pixel circuit 103 is particularly illustrated in more detail.

The liquid crystal display device illustrated in FIG. 1B includes the first substrate 101 and the second substrate 102 as in FIG. 1A. The first substrate 101 includes the pixel circuit 103, the gate line driver circuit 104, the signal line driver circuit 105, the terminal portion 106, and the switching transistor 107. The second substrate 102 includes the common connection portion 108 and the counter electrode 109.

In FIG. 1B, a plurality of gate lines 111 and a plurality of signal lines 112 are arranged in matrix in the pixel circuit 103, and pixels 113 each including a pixel transistor 114 and a liquid crystal element 115 in which a liquid crystal is interposed between a first electrode and a second electrode are provided in intersections portion of the gate lines 111 and the signal lines 112. In FIG. 1B, one of a source terminal and a drain terminal of the pixel transistor 114 is referred to as a first terminal, and the other of the source terminal and the drain terminal is referred to as a second terminal. The first terminal of the pixel transistor 114 is connected to one of the signal lines 112, a gate terminal of the pixel transistor 114 is connected to one of the gate lines 111, and the second terminal of the pixel transistor 114 is connected to the first electrode of the liquid crystal element 115. Note that the first electrode of the liquid crystal element 115 corresponds to the pixel electrode, and the second electrode of the liquid crystal element 115 corresponds to the counter electrode 109.

Note that a semiconductor layer of the pixel transistor 114 included in the pixel is formed using an oxide semiconductor, as in the switching transistor 107. With the use of an oxide semiconductor in a pixel transistor, an off-state current which flows through the pixel transistor can be reduced much, and a period for holding a potential corresponding to an image signal supplied to a pixel electrode can be extended.

Figure 1C:
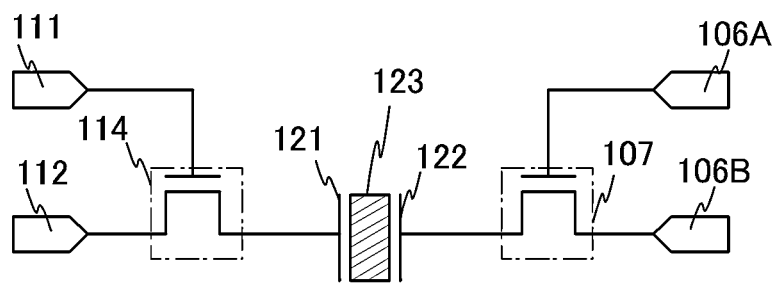

FIG. 1C is a circuit diagram of one pixel of pixels including pixel electrodes. The circuit diagram illustrated in FIG. 1C focuses on the pixel transistor 114 and the switching transistor 107. The gate terminal of the pixel transistor 114 is connected to the gate line 111, the first terminal of the pixel transistor 114 is connected to the signal line 112, and the second terminal of the pixel transistor 114 is connected to the pixel electrode 121. The gate terminal of the switching transistor 107 is connected to a terminal 106A of the terminal portion 106, the first terminal of the switching transistor 107 is connected to a terminal 106B of the terminal portion 106, and the second terminal of the switching transistor 107 is electrically connected to a counter electrode 122 through the common connection portion 108. Note that a liquid crystal 123 is interposed between the pixel electrode 121 and the counter electrode 122. The pixel electrode 121, the counter electrode 122, and the liquid crystal 123 may be collectively referred to as a liquid crystal element.

Note that in FIG. 1C, a storage capacitor may be connected to the liquid crystal element in parallel. The capacitance of the storage capacitor may be set considering the leakage current of a thin film transistor provided in a pixel portion or the like so that electric charges can be held for a predetermined period. The capacitance of the storage capacitor may be set considering the off-state current of a thin film transistor or the like. In this embodiment, because a transistor including a high-purity oxide semiconductor layer is used as the thin film transistor, it is sufficient to provide a storage capacitance which is ⅓ or less, preferably ⅕ or less, of a liquid crystal capacitance in each pixel.

As the liquid crystal 123, a thermotropic liquid crystal, a low-molecular liquid crystal, a high-molecular liquid crystal, a polymer dispersed liquid crystal, a ferroelectric liquid crystal, an anti-ferroelectric liquid crystal, or the like is used. These liquid crystal materials exhibit a cholesteric phase, a smectic phase, a cubic phase, a chiral nematic phase, an isotropic phase, or the like depending on conditions.

The specific resistivity of the liquid crystal 123 is $1\times10^{12}$ Ω·cm or more, preferably more than $1\times10^{13}$ Ω·cm, still preferably more than $1\times10^{14}$ Ω·cm. Note that the specific resistivity in this specification is measured at 20° C. In the case of using a liquid crystal element (also called a liquid crystal cell) in which a liquid crystal is interposed between electrodes, the specific resistivity of the liquid crystal may be $1\times10^{11}$ Ω·cm or more, preferably more than $1\times10^{12}$ Ω·cm in some cases because there is a possibility that an impurity may be mixed into a liquid crystal from an alignment film, a sealant, or the like.

As the specific resistivity of the liquid crystal material increases, the amount of electric charges which leak through the liquid crystal material can be decreased, so that a decrease over time of a voltage for holding the operation state of the liquid crystal element can be suppressed. As a result, the holding period can be extended, the frequency of signal writing can be decreased, and low power consumption of the display device can be achieved.

Further, as the liquid crystal 123, a liquid crystal material exhibiting a blue phase may be used. A blue phase is one of liquid crystal phases, which is generated just before a cholesteric phase changes into an isotropic phase while temperature of cholesteric liquid crystal is increased. Since the blue phase appears only in a narrow temperature range, a liquid crystal composition in which 5 wt. % or more of a chiral agent is mixed is used for the liquid crystal layer in order to improve the temperature range. The liquid crystal composition which includes a liquid crystal showing a blue phase and a chiral agent has a short response time of 1 msec or less, has optical isotropy, which makes the alignment process unneeded, and has a small viewing angle dependence. In addition, since an alignment film does not need to be provided and rubbing treatment is unnecessary, electrostatic discharge damage caused by the rubbing treatment can be prevented and defects and damage of the liquid crystal display device can be reduced in the manufacturing process. Thus, productivity of the liquid crystal display device can be increased. A thin film transistor that uses an oxide semiconductor layer particularly has a possibility that electric characteristics of the thin film transistor may fluctuate significantly by the influence of static electricity and deviate from the designed range. Therefore, it is more effective to use a blue phase liquid crystal material for a liquid crystal display device including a thin film transistor that uses an oxide semiconductor layer.

The structure of this embodiment is not limited to a liquid crystal display device, and may be an EL display device using a light-emitting element such as an electroluminescent element (also called an EL element) as a display element.

Figure 3:
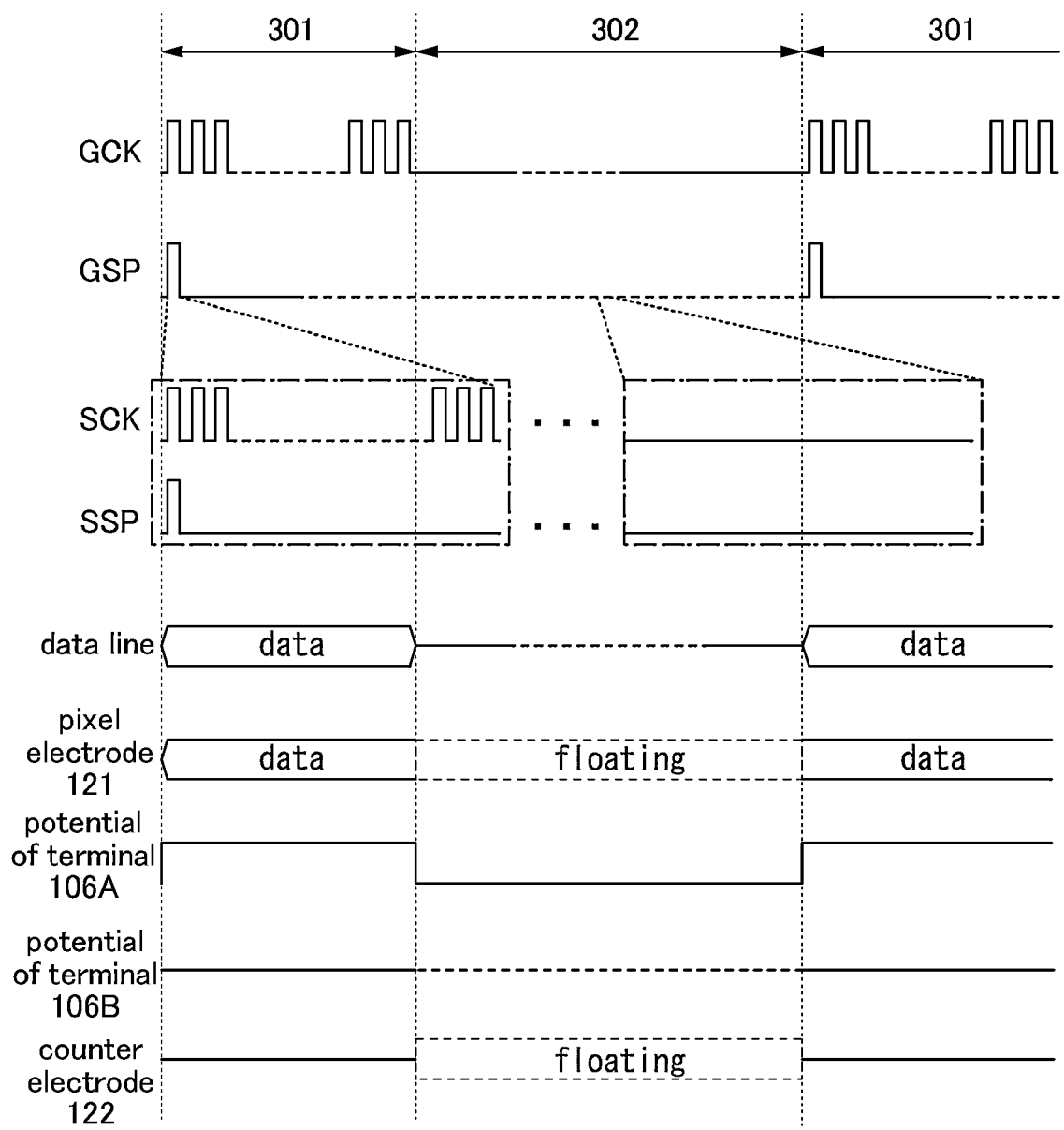
FIG. 3 illustrates a liquid crystal display device of Embodiment 1.

FIG. 3 is a timing chart illustrating the state of signals supplied to the terminals, the gate line driver circuit 104, and the signal line driver circuit 105 in the circuit diagram in FIG. 1C. Note that in order to describe an example of the timing chart, a period 301 in FIG. 3 is regarded as a moving image writing period and a period 302 in FIG. 3 is regarded as a still image display period. The period in FIG. 3 may be determined to be either the moving image writing period or the still image display period in accordance with the result of the determination of whether an image is a moving image or a still image. In FIG. 3, GCK refers to a clock signal supplied to the gate line driver circuit 104; GSP refers to a start pulse supplied to the gate line driver circuit 104; SCK refers to a clock signal supplied to the signal line driver circuit 105; and SSP refers to a start pulse supplied to the signal line driver circuit 105. A potential of the pixel electrode 121, a potential of the terminal 106A, a potential of the terminal 106B, and a potential of the counter electrode 122 are also illustrated in FIG. 3.

Note that the moving image writing period, which is the period 301, corresponds to a period where a difference is detected by the comparison of the image signals of the series of frame periods, and the still image writing period, which is the period 302, corresponds to a period where a difference is not detected by the comparison of the image signals of the series of frame periods. Thus, in the period 301, operation is performed such that the image signals and the common potential are supplied to the pixels in the pixel circuit 103 and the counter electrode. On the other hand, in the period 302, the stop of the image signals and the common potential to the pixels in the pixel circuit 103 and the counter electrode is performed.

Specifically, in the period 301, a clock signal is supplied at all times as a clock signal GCK as illustrated in FIG. 3; and a pulse is supplied in accordance with a vertical synchronizing frequency as a start pulse GSP as illustrated in FIG. 3. In the period 301, a clock signal is supplied at all times as a clock signal SCK as illustrated in FIG. 3; a pulse is supplied in accordance with one gate selection period as a start pulse SSP as illustrated in FIG. 3; an image signal, "data", which is to be supplied to the pixel of each row is supplied to the signal line 112, and the potential of the signal line 112 is supplied to the pixel electrode 121 in the pixel in accordance with the potential of the gate line 111, as illustrated in FIG. 3; and the terminal 106A corresponding to the gate terminal of the switching transistor 107 supplies a potential which makes the switching transistor 107 turned on, so that the common potential, which is the potential of the terminal 106B, is supplied to the counter electrode 122 as illustrated in FIG. 3.

In the period 302, the stop of both the clock signal GCK and the start pulse GSP is performed as illustrated in FIG. 3; the stop of both the clock signal SCK and the start pulse SSP is also performed as illustrated in FIG. 3; and the stop of the image signal, "data", which had been supplied to the signal line 112 is also performed as illustrated in FIG. 3. The stop of both the clock signal GCK and the start pulse GSP is performed, so that the pixel transistor 114 is turned off, the stop of the supplying of the image signal, "data", is performed, and the pixel electrode 121 is brought into a floating state, as illustrated in FIG. 3. Furthermore, the terminal 106A corresponding to the gate terminal of the switching transistor 107 supplies a potential which makes the switching transistor 107 turned off; thus, the stop of the supplying of the common potential, which is the potential of the terminal 106B, is performed. Accordingly, the counter electrode 122 is brought into a floating state.

That is, in the period 302, electrodes in two terminals of the liquid crystal 123, i.e., the pixel electrode 121 and the counter electrode 122, can be brought into a floating state; thus, a still image can be displayed without the supplying of another potential in the period 302. The stop of a clock signal and a start pulse to the gate line driver circuit 104 and the signal line driver circuit 105 is performed, whereby low power consumption can be achieved. With the use of a thin film transistor including a semiconductor layer formed using an oxide semiconductor layer, off-state current can be reduced when two terminals of a liquid crystal element are in a non-conduction state. The pixel transistor 114 and the switching transistor 107 each of which is formed using such a thin film transistor can reduce a current which flows through the liquid crystal element.

As described above, in the thin film transistor including the oxide semiconductor layer, the off-state current can be reduced to less than or equal to 10 aA/μm, so that the holding period where the pixel electrode 121 and the counter electrode 122 are brought into a floating state, can be extended as compared to a thin film transistor including a semiconductor layer formed using amorphous silicon or the like. Accordingly, a synergistic effect is expected to be generated in reduction of power consumption when a still image is displayed in this embodiment.

Note that the resistivity of the liquid crystal 123 in FIG. 1C is approximately $1 \times 10^{12}$ Ω·cm to $1 \times 10^{13}$ Ω·cm. In the period 302 in FIG. 3, the two terminals of the liquid crystal 123, i.e., the pixel electrode 121 and the counter electrode 122, can be brought into a floating state with the use of a thin film transistor which has almost no off-state current. Thus, off-state current which flows through the liquid crystal 123 due to a voltage applied to the two terminals of the liquid crystal 123, can be reduced.

Consequently, a liquid crystal display device can be provided in which low power consumption can be achieved and image distortion can be reduced in displaying a still image.

This embodiment can be implemented in appropriate combination with any of the structures described in the other embodiments.

(Embodiment 2)

A structure of the liquid crystal display device in Embodiment 1 is described with reference to a specific top view and cross-sectional views in FIGS. 4A to 4C.

Figure 4A:
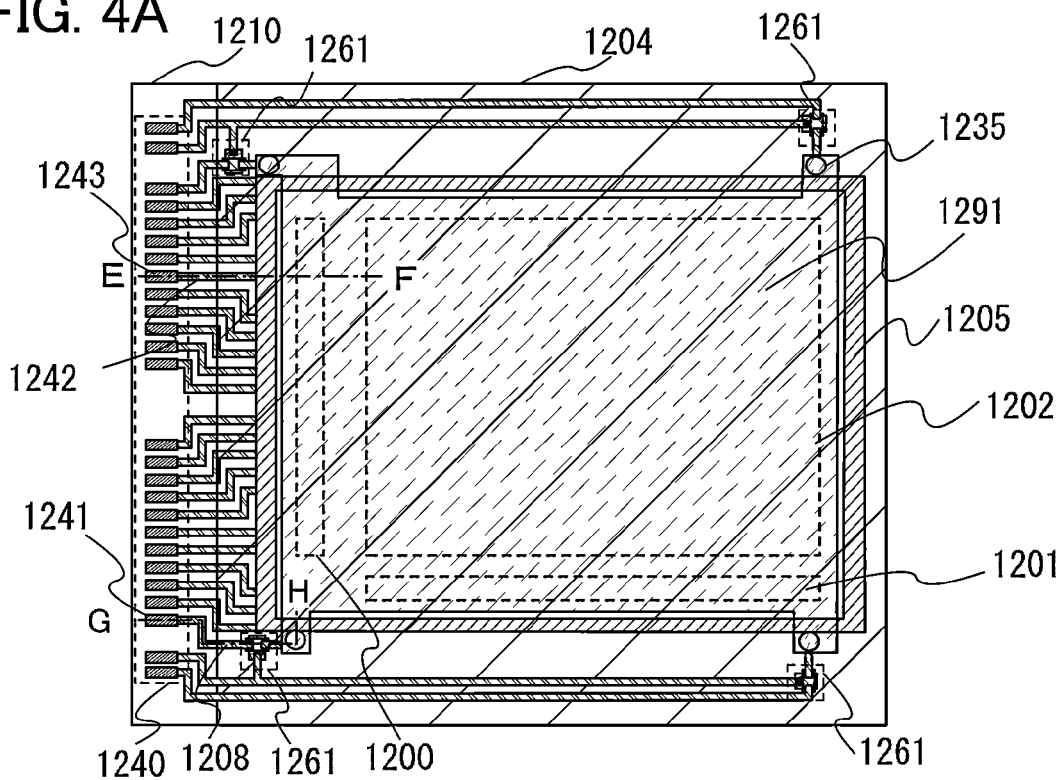
FIGS. 4A to 4C illustrate a liquid crystal display device of Embodiment 2.

FIG. 4A is a top view of a liquid crystal display device of the present invention. FIG. 4A is a top view of a liquid crystal display device in which a flexible printed circuit, an FPC, has not been attached to a first substrate 1210. FIG. 4B is a cross-sectional view taken along line G-H of FIG. 4A, which shows a connection region of a conductive particle and a connection wiring. FIG. 4C is a cross-sectional view taken along line E-F of FIG. 4A, which shows a connection region of a pixel circuit and a connection wiring.

Figure 4B:
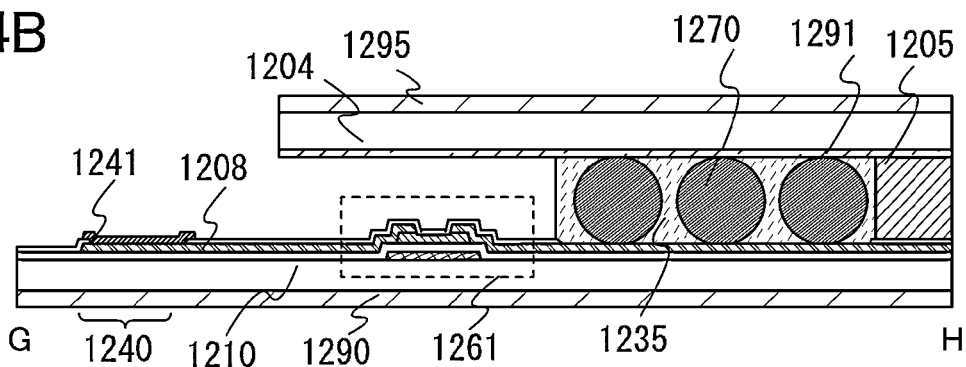
Figure 4C:
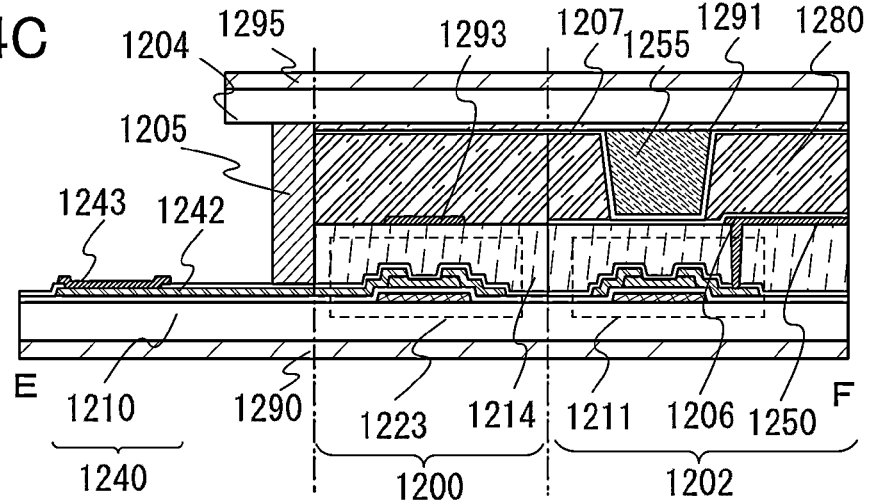

Although FIGS. 4A to 4C illustrate an example of a transmissive liquid crystal display device, this embodiment is applicable to a transflective liquid crystal display device and a reflective liquid crystal display device.

The first substrate 1210 which is provided with pixel electrodes, which serves as an active matrix substrate, and a second substrate 1204 provided with a counter electrode 1291 are attached to each other with a sealing material 1205, and the interior space surrounded by the sealing material 1205 is filled with a liquid crystal 1280. A signal line driver circuit 1200, a scan line driver circuit 1201, and a pixel circuit 1202 in which the pixel electrodes are formed in a matrix form are formed over the first substrate 1210.

The counter electrode 1291 is electrically connected to a terminal portion 1240 through a connection wiring 1208 extending from the terminal portion 1240, a switching transistor 1261, and a resin layer 1235 which is provided with a conductive particle interposed between the pair of substrates. The number of the connections between the counter electrode and the terminal portion may be at least one, and the number of the connections may be two or more.

As a driver circuit portion, the signal line driver circuit 1200 provided with a circuit including a driver circuit thin film transistor 1223 over the first substrate 1210 is illustrated. Further, the scan line driver circuit 1201 including a driver circuit thin film transistor is provided over the first substrate.

The pixel circuit 1202 includes a pixel transistor 1211. Further, a pixel electrode 1250 which is connected to the pixel transistor 1211 is formed over and in an insulating layer 1214.

The pixel transistor 1211, the driver circuit thin film transistor 1223, and the switching transistor 1261 are each formed using an oxide semiconductor layer, a gate insulating layer, and a gate electrode layer. A conductive layer 1293 overlapping with the gate electrode layer and the oxide semiconductor layer with the insulating layer 1214 interposed therebetween is provided over the driver circuit thin film transistor 1223. The switching transistor 1261 is electrically connected to the counter electrode 1291 through a conductive particle 1270 in the resin layer 1235.

Although the switching transistor 1261 is on an outer side than the sealing material 1205 in FIG. 4A, the switching transistor may be on an inner side than the sealing material 1205. For example, the switching transistor may be provided in a region where the signal line driver circuit 1200 is formed. The switching transistor 1261 on an inner side than the sealing material 1205 can be protected against an impact from an external source, and the like. Thus, the lifetime of the switching transistor 1261 can be made long.

In the driver circuit thin film transistor 1223, the oxide semiconductor layer is interposed between the gate electrode layer and the conductive layer 1293. With such a structure, variation in threshold voltage of the driver circuit thin film transistor 1223 can be reduced, so that a liquid crystal display device provided with the driver circuit thin film transistor 1223, which has stable electric characteristics, can be provided. The conductive layer 1293 may be at the same potential as the gate electrode layer or may be at a floating potential or a fixed potential such as a GND potential or 0 V. By setting the potential of the conductive layer 1293 to an appropriate value, the threshold voltage of the driver circuit thin film transistor 1223 can be controlled.

As each of the first substrate 1210 and the second substrate 1204, any glass substrate used in the electronics industry such as an aluminosilicate glass substrate, an aluminoborosilicate glass substrate, or a barium borosilicate glass substrate (such a substrate is also called "non-alkali glass substrate"), a quartz substrate, a ceramic substrate, a plastic substrate, or the like can be used as appropriate. By using a flexible plastic substrate as each of the first substrate 1210 and the second substrate 1204, a flexible liquid crystal display device can be manufactured.

The sealing material 1205 is applied over the first substrate or the second substrate by a screen printing method, or with an ink-jet apparatus or a dispensing apparatus. As the sealing material 1205, typically, a material containing a visible light curable resin, an ultraviolet curable resin, or a thermosetting resin can be used. For example, an epoxy resin such as a liquid bisphenol-A resin, a solid bisphenol-A resin, an epoxy bromine-containing resin, a bisphenol-F resin, a bisphenol-AD resin, a phenol resin, a cresol resin, a novolac resin, a cycloaliphatic epoxy resin, an Epi-Bis type epoxy resin, a glycidyl ester resin, a glycidyl amine resin, a heterocyclic epoxy resin, or a modified epoxy resin can be used. As the sealing material 1205, a material having a viscosity in the range of 40 Pa·s to 400 Pa·s is used. Further, a filler (1 µm to 24 µm in diameter) may be contained. Note that it is prefer-able to select as the sealing material, a sealing material which is insoluble in liquid crystals which are in contact with the sealing material later.

As the conductive particle 1270, a conductive particle in which an insulating sphere is covered with a thin metal film can be used. The insulating sphere is formed using silica glass, hard resin, or the like. The thin metal film can be formed using a single layer or a stack of gold, silver, palladium, nickel, ITO, and/or IZO. For example, as the thin metal film, a thin gold film, a stack of a thin nickel film and a thin gold film, or the like can be used. By using the conductive particle in which the insulating sphere is contained at the center, elasticity can be improved so that destruction due to pressure from an external source can be reduced.

The kind of the pixel electrode 1250 is different in a transmissive liquid crystal display device and a reflective liquid crystal display device. In the case of a transmissive liquid crystal display device, the pixel electrode 1250 is formed using a light-transmitting material. As examples of the light-transmitting material, indium tin oxide (ITO), zinc oxide (ZnO), indium zinc oxide (IZO), gallium-doped zinc oxide (GZO), and the like can be given.

Further, the pixel electrode 1250 can be formed using a conductive composition including a conductive polymer, as well. The pixel electrode formed using the conductive composition preferably has a sheet resistance of less than or equal to 10000 ohms per square and a transmittance of greater than or equal to 70% at a wavelength of 550 nm. Further, the resistivity of the conductive high molecule included in the conductive composition is preferably less than or equal to 0.1 Ω·cm.

As the conductive polymer, a so-called π-electron conjugated conductive polymer can be used. For example, polyaniline or a derivative thereof, polypyrrole or a derivative thereof, polythiophene or a derivative thereof, a copolymer of two or more kinds of them, and the like can be given.

On the other hand, in the case of a reflective liquid crystal display device, a metal electrode having high reflectivity is used as the pixel electrode. Specifically, aluminum, silver, or the like is used. Further, the reflectivity is increased by making the surface of the pixel electrode rough. Therefore, a base film of the pixel electrode may be made rough.

Further, in the case of a transflective liquid crystal display device, a transmissive material and a reflective material are used for the pixel electrode.

Further, the terminal portion 1240 is formed in an edge portion of the first substrate 1210. In the terminal portion 1240, a connection terminal 1241 is formed over the connection wiring 1208.

FIG. 4B is a cross-sectional view of a region where the conductive particle 1270 and the connection terminal are connected to each other. The connection wiring 1208 and the switching transistor 1261 are formed over the first substrate 1210. The connection terminal 1241 formed at the same time as the pixel electrode 1250 is formed over the connection wiring 1208. The connection terminal 1241 is electrically connected to the counter electrode 1291 through the connection wiring 1208, the switching transistor 1261, and the conductive particle 1270. Further, the connection terminal 1241 is connected to an FPC (not shown). Note that in FIG. 4B, the conductive particle 1270 is fixed by the resin layer 1235. The resin layer 1235 can be formed using an organic resin material like that used for the sealing material 1205.

FIG. 4C is a cross-sectional view of a region where the pixel electrode and the connection terminal are connected to each other. A connection wiring 1242 formed at the same time as a source electrode layer and a drain electrode layer of the thin film transistor is formed over the first substrate 1210. A connection terminal 1243 formed at the same time as the pixel electrode 1250 is formed over the connection wiring 1242. The connection terminal 1243 is electrically connected to the pixel electrode 1250 through the connection wiring 1242. Note that, since an active matrix liquid crystal display device is used in this embodiment, the pixel electrode 1250 and the connection wiring 1242 are not directly connected but are connected through the pixel transistor 1211 or the signal line driver circuit 1200.

An alignment film 1206 is provided over the pixel electrode 1250, and rubbing is performed thereon. The alignment film 1206 and rubbing are not necessarily required, which depends on the mode of liquid crystals.

For the second substrate 1204 which serves as a counter substrate, a black matrix may be provided at a position overlapping with the signal line driver circuit 1200, and a color filter, a protective layer, and the like may be provided at a position overlapping with the pixel circuit 1202. The counter electrode 1291 is formed, and an alignment film 1207 is provided on the counter electrode 1291, and rubbing is performed thereon. As in the case of the first substrate 1210, an alignment film and rubbing are not necessarily required for the second substrate 1204 depending on the mode of liquid crystals.

The second substrate 1204 provided with the counter electrode 1291 or the first substrate 1210 provided with the pixel electrode 1250 is further provided with a pillar spacer 1255. The pillar spacer 1255 is provided to keep a distance between the first substrate 1210 and the second substrate 1204. In this embodiment, an example is described in which the pillar spacer 1255 is provided on the second substrate 1204 side. The pillar spacer is also called a photolitho spacer, a post spacer, a scallop spacer, or a column spacer; in this embodiment, it is referred to as a pillar spacer. Alternatively, a spherical spacer may be used. In this embodiment, a pillar spacer is used. As for a method for forming the pillar spacer 1255, an organic insulating material such as photosensitive acrylic is applied to an entire surface of the substrate by a spin coating method, and a series of photolithography steps is performed thereon, so that photosensitive acrylic which remains over the substrate serves as the spacer. With this method, a place for disposing a spacer can be exposed to light in accordance with a mask pattern at the time of light exposure. The pillar spacer disposed at a portion where the liquid crystal does not drive can prevent the leakage of light transmitted through the liquid crystal as well as maintaining the distance between the upper and lower substrates is maintained. Further, the pillar spacer 1255 can be formed by discharging a composition containing an organic insulating material by an ink-jet method and performing baking thereon.

The space around the conductive particle 1270 may be filled with a conductive polymer. As typical examples of the conductive polymer, conductive polyaniline, conductive polypyrrole, conductive polythiophen, a complex of poly(3, 4-ethylenedioxythiophene) (PEDOT) and poly(styrenesulfonic acid) (PSS), and the like can be given. Further, any of the afore-mentioned examples of the conductive polymer which can be used for the pixel electrode 1250 can be used as appropriate, as well. The conductive polymer is formed by applying the conductive polymer with an ink-jet apparatus, a dispensing apparatus, or the like. That is, when the conductive polymer is in contact with the counter electrode or the connection wiring, the conductive particle 1270 and the conductive polymer are in contact with the counter electrode and the connection wiring, so that connection resistance between the counter electrode and the connection wiring can be reduced.

Note that the connection wiring 1208 and the counter electrode 1291 formed on the second substrate 1204 are electrically connected to each other through the conductive particle 1270.

The sealing material 1205 and the conductive particle 1270 are discharged over the first substrate 1210 or the second substrate 1204, and then liquid crystals are discharged in a space surrounded by the sealing material 1205. After that, the first substrate 1210 and the second substrate 1204 are attached to each other in reduced pressure, UV light irradiation is performed thereon to cure the sealing material 1205, and then heat treatment is performed thereon to further harden the sealing material 1205, so that the first substrate 1210 and the second substrate 1204 are firmly fixed. Further, the orientation of the liquid crystals is made uniform by the heat treatment.

Consequently, the first substrate 1210 and the second substrate 1204 can be attached to each other.

Then, the first substrate 1210 and the second substrate 1204 are cut to have a panel shape. Furthermore, in order to improve the contrast, a first polarizing plate 1290 and a second polarizing plate 1295 are provided for the outsides of the first substrate 1210 and the second substrate 1204 respectively. Note that the first polarizing plate 1290 is not necessarily provided in the case of a reflective display device.

Although not illustrated in this embodiment, a black matrix (a light-blocking layer), an optical member (an optical substrate) such as a polarizing member, a retardation member, or an anti-reflection member, and the like are provided as appropriate. For example, circular polarization may be obtained by using a polarizing substrate and a retardation substrate. In addition, a backlight, a side light, or the like may be used as a light source.

In an active matrix liquid crystal display device, pixel electrodes arranged in a matrix form are driven to form a display pattern on a screen. Specifically, voltage is applied between a selected pixel electrode and a counter electrode corresponding to the pixel electrode, so that a liquid crystal layer provided between the pixel electrode and the counter electrode is optically modulated and this optical modulation is recognized as a display pattern by an observer.

In the structure of a liquid crystal display device including a thin film transistor formed using an oxide semiconductor layer, low power consumption can be achieved and image distortion can be reduced in displaying a still image as in Embodiment 1.

This embodiment can be implemented in appropriate combination with any of the structures described in the other embodiments.

(Embodiment 3)

In this embodiment, an example of thin film transistors applicable to a liquid crystal display device disclosed in this specification is described. A thin film transistor 410 and a thin film transistor 420 to be described in this embodiment can be used as the switching transistor 1261 and the pixel transistor 1211 in Embodiment 2, respectively.

An embodiment of a liquid crystal display device of this embodiment and a manufacturing method of the liquid crystal display device is described with reference to FIGS. 5A to 5E.

FIGS. 5A to 5E illustrate an example of a cross-sectional structure of a liquid crystal display device. The thin film transistors 410 and 420 in FIGS. 5A to 5E each have a kind of bottom-gate structure called a channel-etched type and are also referred to as inverted-staggered thin film transistors. In FIGS. 5A to 5E, the thin film transistor 410 is a switching transistor and the thin film transistor 420 is a pixel transistor.

Although description is given using single-gate thin film transistors as the thin film transistors 410 and 420, multi-gate thin film transistors each including a plurality of channel formation regions may be formed as needed.

A process of manufacturing the thin film transistors 410 and 420 over a substrate 400 is described below with reference to FIGS. 5A to 5E.

First, a conductive film is formed over the substrate 400 having an insulating surface, and then, gate electrode layers 411 and 421 are formed in a first photolithography step. Note that a resist mask may be formed by an ink-jet method. Formation of the resist mask by an ink-jet method needs no photomask; thus, manufacturing cost can be reduced.

Although there is no particular limitation on a substrate which can be used as the substrate 400 having an insulating surface, it is necessary that the substrate have at least enough heat resistance to withstand a heat treatment to be performed later. A glass substrate formed of barium borosilicate glass, aluminoborosilicate glass, or the like can be used.

In the case where a glass substrate is used and the temperature at which the heat treatment is to be performed later is high, a glass substrate whose strain point is higher than or equal to 730° C. is preferably used. As a glass substrate, a glass material such as aluminosilicate glass, aluminoborosilicate glass, or barium borosilicate glass is used, for example. Note that by containing a larger amount of barium oxide (BaO) than boron oxide ($B_2O_3$), a more practical heat-resistant glass substrate can be obtained. Therefore, a glass substrate containing a larger amount of BaO than $B_2O_3$ is preferably used.

Note that instead of the above glass substrate, a substrate formed using an insulator such as a ceramic substrate, a quartz substrate, or a sapphire substrate may be used. Alternatively, a crystallized glass substrate or the like can be used.

An insulating film serving as a base film may be provided between the substrate 400 and the gate electrode layers 411 and between the substrate 400 and the gate electrode layer 421. The base film has a function of preventing diffusion of an impurity element from the substrate 400, and can be formed to have a single-layer or stacked-layer structure using one or more of a silicon nitride film, a silicon oxide film, a silicon nitride oxide film, and a silicon oxynitride film.

The gate electrode layers 411 and 421 can each be formed to have a single-layer or stacked-layer structure using any of metal materials such as molybdenum, titanium, chromium, tantalum, tungsten, aluminum, copper, neodymium, and scandium; or an alloy material which contains any of these materials as its main component.

As a two-layer stacked structure of each of the gate electrode layers 411 and 421, for example, a two-layer stacked structure in which a molybdenum layer is stacked over an aluminum layer, a two-layer stacked structure in which a molybdenum layer is stacked over a copper layer, a two-layer stacked structure in which a titanium nitride layer or a tantalum nitride layer is stacked over a copper layer, or a two-layer stacked structure in which a titanium nitride layer and a molybdenum layer are stacked is preferable. As a three-layer stacked structure, a stacked layer structure in which a tungsten layer or a tungsten nitride layer, an alloy of aluminum and silicon or an alloy of aluminum and titanium, and a titanium nitride layer or a titanium layer are stacked is preferable.

Next, a gate insulating layer 402 is formed over the gate electrode layers 411 and 421.

The gate insulating layer 402 can be formed to have a single layer of a silicon oxide layer, a silicon nitride layer, a silicon oxynitride layer, a silicon nitride oxide layer, or an aluminum oxide layer or a stacked layer thereof by a plasma CVD method, a sputtering method, or the like. For example, a silicon oxynitride layer may be formed by a plasma CVD method using $SiH_4$, oxygen, and nitrogen as a deposition gas. Furthermore, a high-k material such as hafnium oxide ($HfO_x$) or tantalum oxide ($TaO_x$) can be used as the gate insulating layer. The gate insulating layer 402 is formed to a thickness of 100 nm to 500 nm inclusive; in the case where the gate insulating layer 402 is formed to have a stacked-layer structure, for example, a first gate insulating layer with a thickness of 50 nm to 200 nm inclusive and a second gate insulating layer with a thickness of 5 nm to 300 nm inclusive are stacked.

In this embodiment, a silicon oxynitride layer is formed to a thickness of 100 nm or less by a plasma CVD method as the gate insulating layer 402.

Further, as the gate insulating layer 402, a silicon oxynitride film may be formed using a high-density plasma apparatus. Here, a high-density plasma apparatus refers to an apparatus which can realize a plasma density higher than or equal to $1 \times 10^{11}/cm^3$. For example, plasma is generated by applying a microwave power higher than or equal to 3 kW and lower than or equal to 6 kW so that an insulating film is formed.

A monosilane gas ($SiH_4$), nitrous oxide ($N_2O$), and a rare gas are introduced into a chamber as a source gas to generate high-density plasma at a pressure higher than or equal to 10 Pa and lower than or equal to 30 Pa so that an insulating film is formed over a substrate having an insulating surface, such as a glass substrate. After that, the supply of a monosilane gas is stopped, and nitrous oxide ($N_2O$) and a rare gas are introduced without exposure to the air, so that plasma treatment may be performed on a surface of the insulating film. The plasma treatment performed on the surface of the insulating film by introducing nitrous oxide ($N_2O$) and a rare gas is performed at least after the insulating film is formed. The insulating film formed through the above process procedure has small thickness and corresponds to an insulating film whose reliability can be ensured even though it has a thickness less than 100 nm, for example.

In forming the gate insulating layer 402, the flow ratio of a monosilane gas ($SiH_4$) to nitrous oxide ($N_2O$) which are introduced into the chamber is in the range of 1:10 to 1:200. In addition, as a rare gas which is introduced into the chamber, helium, argon, krypton, xenon, or the like can be used. In particular, argon, which is inexpensive, is preferably used.

In addition, since the insulating film formed by using the high-density plasma apparatus can have uniform thickness, the insulating film has excellent step coverage. Further, the thickness of a thin insulating film formed with the high-density plasma apparatus can be controlled precisely.

The insulating film formed through the above process procedure is greatly different from an insulating film formed using a conventional parallel plate plasma CVD apparatus. The etching rate of the insulating film formed through the above process procedure is lower than that of the insulating film formed using the conventional parallel plate plasma CVD apparatus by 10% or more or 20% or more in the case where the etching rates with the same etchant are compared to each other. Thus, it can be said that the insulating film formed using the high-density plasma apparatus is a dense film.

The oxide semiconductor which becomes I-type or becomes substantially I-type (an oxide semiconductor which is purified) in a later step is extremely sensitive to an interface state or an interface electric charge; therefore, an interface with the gate insulating film is important. Thus, higher quality is demanded for the gate insulating film (GI) in contact with the highly purified oxide semiconductor. Therefore, high-density plasma CVD with use of microwaves (2.45 GHz) is preferably employed since formation of a dense and high-quality insulating film having high withstand voltage is possible. When the highly purified oxide semiconductor and the high-quality gate insulating film are in close contact with each other, the interface state density can be reduced and favorable interface characteristics can be obtained. It is important that an insulating film has a reduced interface state density with the oxide semiconductor and can form a favorable interface as well as having a favorable film quality as a gate insulating film.

Then, an oxide semiconductor film 430 is formed to a thickness of 2 nm to 200 nm inclusive over the gate insulating layer 402. The oxide semiconductor film 430 preferably has a thickness of 50 nm or less so as to remain in an amorphous state even when heat treatment for dehydration or dehydrogenation is performed after the oxide semiconductor film 430 is formed. The small thickness of the oxide semiconductor film makes it possible to prevent the oxide semiconductor film from being crystallized when heat treatment is performed after the formation of the oxide semiconductor film.

Note that before the oxide semiconductor film 430 is formed by a sputtering method, dust attached to a surface of the gate insulating layer 402 is preferably removed by reverse sputtering in which an argon gas is introduced and plasma is generated. The reverse sputtering refers to a method in which, without application of a voltage to a target side, an RF power source is used for application of a voltage to a substrate side in an argon atmosphere to modify a surface. Note that instead of an argon atmosphere, a nitrogen atmosphere, a helium atmosphere, an oxygen atmosphere, or the like may be used.

Figure 5A:
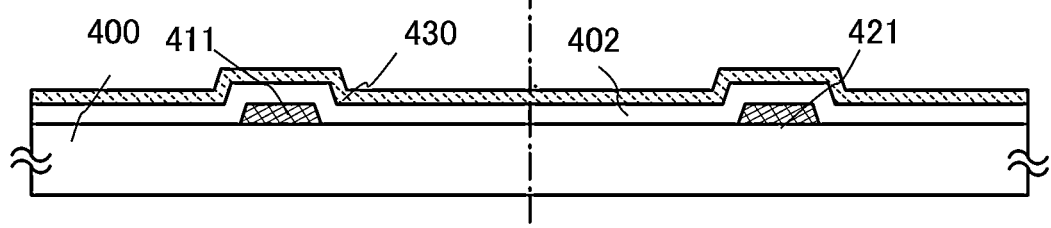
FIGS. 5A to 5E illustrate cross sections of thin film transistors of Embodiment 3.

As the oxide semiconductor film 430, an In—Ga—Zn—O-based oxide semiconductor film, an In—Sn—O-based oxide semiconductor film, an In—Sn—Zn—O-based oxide semiconductor film, an In—Al—Zn—O-based oxide semiconductor film, an Sn—Ga—Zn—O-based oxide semiconductor film, an Al—Ga—Zn—O-based oxide semiconductor film, an Sn—Al—Zn—O-based oxide semiconductor film, an In—Zn—O-based oxide semiconductor film, an Sn—Zn—O-based oxide semiconductor film, an Al—Zn—O-based oxide semiconductor film, an In—O-based oxide semiconductor film, an Sn—O-based oxide semiconductor film, or a Zn—O-based oxide semiconductor film is used. In this embodiment, the oxide semiconductor film 430 is formed by a sputtering method with the use of an In—Ga—Zn—O-based oxide semiconductor target. A cross-sectional view at this stage is shown in FIG. 5A. Alternatively, the oxide semiconductor film 430 can be formed by a sputtering method in a rare gas (typically argon) atmosphere, an oxygen atmosphere, or an atmosphere containing a rare gas (typically argon) and oxygen. In the case of using a sputtering method, it is preferable to form the oxide semiconductor film using a target including $SiO_2$ at 2 wt % to 10 wt % inclusive such that $SiO_x$ (x>0) which inhibits crystallization is contained in the oxide semiconductor film 430 in order to prevent the oxide semiconductor film from being crystallized in heat treatment for dehydration or dehydrogenation which is performed later.

In this embodiment, film deposition is performed using an oxide semiconductor target containing In, Ga, and Zn ($In_2O_3$:$Ga_2O_3$:ZnO=1:1:1 [mol %], that is, In:Ga:Zn=1:1:0.5 [at %]). The deposition condition is set as follows: the distance between the substrate and the target is 100 mm, the pressure is 0.2 Pa, the direct current (DC) power supply is 0.5 kW, and the atmosphere is a mixed atmosphere of argon and oxygen (argon:oxygen=30 sccm:20 sccm and the oxygen flow rate is 40%). Note that when a pulse direct current (DC) power source is used, powder substances (also referred to as particles or dust) generated in film deposition can be reduced and the film thickness is likely to be uniform. The In—Ga—Zn—O-based film is formed to a thickness of 5 nm to 200 nm inclusive. In this embodiment, as the oxide semiconductor film, a 20-nm-thick In—Ga—Zn—O-based film is formed by a sputtering method with use of an In—Ga—Zn—O-based oxide semiconductor target. Alternatively, as an oxide semiconductor target containing In, Ga, and Zn, a target having such composition ratio that In:Ga:Zn=1:1:1 [at %] or In:Ga:Zn=1:1:2 [at %] can be used.

Examples of a sputtering method include an RF sputtering method in which a high-frequency power source is used as a sputtering power source, a DC sputtering method using a DC power source, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are a sputtering apparatus provided with a magnet system inside the chamber and used for a magnetron sputtering, and a sputtering apparatus used for an ECR sputtering in which plasma generated with the use of microwaves is used without using glow discharge.

Furthermore, as a deposition method by sputtering, there are also a reactive sputtering method in which a target substance and a sputtering gas component are chemically reacted with each other during deposition to form a thin compound film thereof, and a bias sputtering in which a voltage is also applied to a substrate during deposition.

Then, the oxide semiconductor film 430 is processed into island-shaped oxide semiconductor layers in a second photolithography step. A resist mask for forming the island-shaped oxide semiconductor layers may be formed by an ink-jet method. Formation of the resist mask by an ink-jet method needs no photomask; thus, manufacturing cost can be reduced.

Figure 5B:
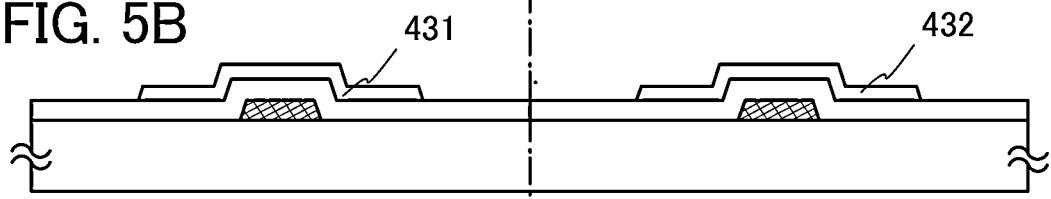
Figure 5C:
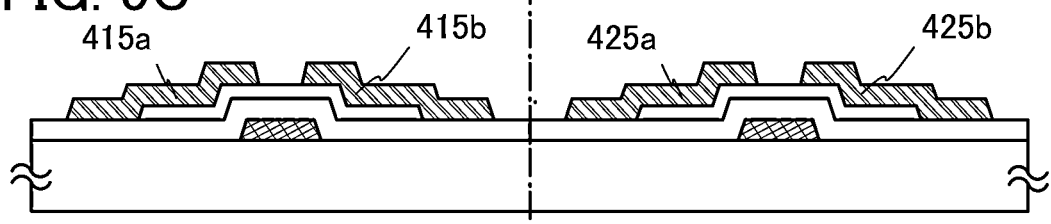
Figure 5D:
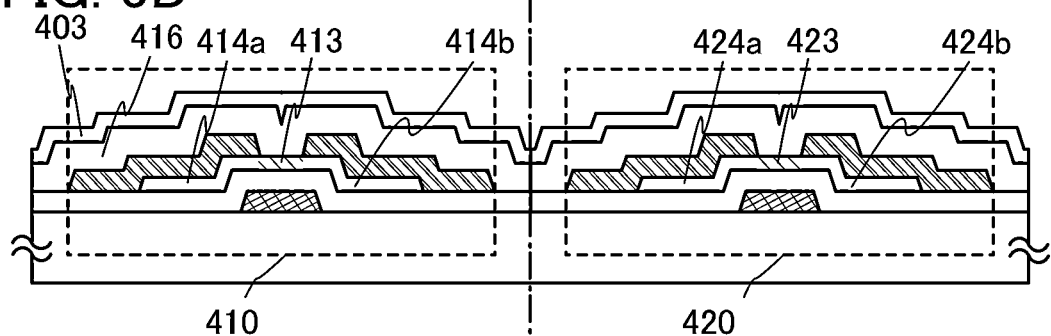

Next, dehydration or dehydrogenation of the oxide semiconductor layers is performed. The temperature of first heat treatment for dehydration or dehydrogenation is higher than or equal to 400° C. and lower than or equal to 750° C., preferably higher than or equal to 400° C. and lower than the strain point of the substrate. In this embodiment, the substrate is introduced into an electric furnace which is one of heat treatment apparatuses, heat treatment is performed on the oxide semiconductor layers in a nitrogen atmosphere at 450° C. for one hour. Then, the oxide semiconductor layers are not exposed to the air so that entry of water and hydrogen into the oxide semiconductor layers is prevented. Thus, oxide semiconductor layers 431 and 432 are obtained (FIG. 5B).

The heat treatment apparatus is not limited to an electric furnace and can be provided with a device that heats an object to be processed by thermal conduction or thermal radiation from a heater such as a resistance heater or the like. For example, an RTA (rapid thermal annealing) apparatus such as a GRTA (gas rapid thermal annealing) apparatus or an LRTA (lamp rapid thermal annealing) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heat treatment using a high-temperature gas. As the gas, an inert gas which does not react with an object to be processed by heat treatment, such as nitrogen or a rare gas such as argon is used.

For example, as the first heat treatment, GRTA by which the substrate is moved into an inert gas heated to a high temperature as high as 650° C. to 700° C., heated for several minutes, and moved out of the inert gas heated to the high temperature may be performed. With GRTA, high-temperature heat treatment for a short period of time can be achieved.

Note that in the first heat treatment, it is preferable that water, hydrogen, and the like be not contained in the atmosphere of nitrogen or a rare gas such as helium, neon, or argon. It is preferable that the purity of nitrogen or the rare gas such as helium, neon, or argon which is introduced into a heat treatment apparatus be set to be 6N (99.9999%) or higher, preferably 7N (99.99999%) or higher (that is, the impurity concentration is 1 ppm or lower, preferably 0.1 ppm or lower).

Depending on conditions of the first heat treatment or a material of the oxide semiconductor layer, the oxide semiconductor film may be crystallized to be a microcrystalline film or a polycrystalline film in some cases. For example, the oxide semiconductor layer may crystallize to become a microcrystalline oxide semiconductor film having a degree of crystallization of 90% or more, or 80% or more. Alternatively, depending on the condition of the first heat treatment and the material for the oxide semiconductor layer, the oxide semiconductor layer might become an amorphous oxide semiconductor film containing no crystalline component. The oxide semiconductor layer may become an oxide semiconductor film in which a microcrystalline portion (with a grain diameter greater than or equal to 1 nm and less than or equal to 20 nm, typically greater than or equal to 2 nm and less than or equal to 4 nm) is mixed into an amorphous oxide semiconductor. A needle-like crystal in a longitudinal direction (the film-thickness direction) may be generated on the surface side of the oxide semiconductor film in the case where heat treatment at a high temperature is performed using RTA (e.g., GRTA or LRTA).

The first heat treatment of the oxide semiconductor layers may be performed on the oxide semiconductor film 430 which has not yet been processed into the island-shaped oxide semiconductor layers. In that case, the substrate is taken out from the heat apparatus after the first heat treatment, and then a photolithography step is performed.

The heat treatment for dehydration or dehydrogenation of the oxide semiconductor layer may be performed at any of the following timings: after the oxide semiconductor layer is formed; after a source electrode and a drain electrode are formed over the oxide semiconductor layer; and after a protective insulating film is formed over the source electrode and the drain electrode.

Further, in the case where an opening portion is formed in the gate insulating layer 402, the step of forming the opening portion may be performed either before or after the oxide semiconductor film 430 is subjected to dehydration or dehydrogenation treatment.

Note that the etching of the oxide semiconductor film may be dry etching, without limitation to wet etching.

As the sputtering gas for dry etching, a gas containing chlorine (chlorine-based gas such as chlorine ($Cl_2$), trichloroboron ($BCl_3$), tetrachlorosilane ($SiCl_4$), or tetrachloromethane ($CCl_4$)) is preferably used.

Alternatively, a gas containing fluorine (fluorine-based gas such as carbon tetrafluoride ($CF_4$), sulfur fluoride ($SF_6$), nitrogen fluoride ($NF_3$), or trifluoromethane ($CHF_3$)); hydrogen bromide (HBr); oxygen ($O_2$); any of these gases to which a rare gas such as helium (He) or argon (Ar) is added; or the like can be used.

As the dry etching method, a parallel plate RIE (reactive ion etching) method or an ICP (inductively coupled plasma) etching method can be used. In order to etch the film into desired shapes, the etching condition (the amount of electric power applied to a coil-shaped electrode, the amount of electric power applied to an electrode on a substrate side, the temperature of the electrode on the substrate side, or the like) is adjusted as appropriate.

As an etchant used for wet etching, a solution obtained by mixing phosphoric acid, acetic acid, and nitric acid, an ammonia peroxide mixture (hydrogen peroxide water at 31 wt %:ammonia water at 28 wt %:water=5:2:2), or the like can be used. In addition, ITO07N (produced by KANTO CHEMICAL CO., INC.) may also be used.

The etchant used in the wet etching is removed by cleaning together with the etched materials. The waste liquid including the etchant and the material etched off may be purified and the material may be reused. When a material such as indium included in the oxide semiconductor layer is collected from the waste liquid after the etching and reused, the resources can be efficiently used and the cost can be reduced.

The etching conditions (such as an etchant, etching time, and temperature) are appropriately adjusted depending on the material so that the material can be etched into a desired shape.

Next, a metal conductive film is formed over the gate insulating layer 402 and the oxide semiconductor layers 431 and 432. The metal conductive film may be formed by a sputtering method or a vacuum evaporation method. As a material of the metal conductive film, there are an element selected from Al, Cr, Cu, Ta, Ti, Mo, and W, an alloy including any of the elements, an alloy in which any of the elements are combined, and the like. Further, one or more of materials selected from manganese, magnesium, zirconium, beryllium, and thorium may be used. Further, the metal conductive film may have a single-layer structure or a stacked-layer structure of two or more layers. For example, a single-layer structure of an aluminum film including silicon, a two-layer structure in which a titanium film is stacked over an aluminum film, a three-layer structure in which a Ti film, an aluminum film, and a Ti film are stacked in the order presented, and the like can be given. Alternatively, a film, an alloy film, or a nitride film of a combination of Al and one or more of elements selected from the followings may be used: titanium (Ti), tantalum (Ta), tungsten (W), molybdenum (Mo), chromium (Cr), neodymium (Nd), and scandium (Sc).

If heat treatment is performed after formation of the metal conductive film, it is preferable that the metal conductive film have heat resistance enough to withstand the heat treatment.

A third photolithography step is performed. A resist mask is formed over the metal conductive film and selective etching is performed, whereby a source electrode layer 415*a*, a drain electrode layer 415*b*, a source electrode layer 425*a*, and a drain electrode layer 425*b* are formed. Then, the resist mask is removed (see FIG. 5C).

Note that materials and etching conditions are adjusted as appropriate so that the oxide semiconductor layers 431 and 432 are not removed by etching of the metal conductive film.

In this embodiment, a Ti film is used as the metal conductive film, an In—Ga—Zn—O based oxide is used as the oxide semiconductor layers 431 and 432, and an ammonia peroxide mixture (hydrogen peroxide water at 31 wt %:ammonia water at 28 wt %:water=5:2:2) is used as the etchant.

Note that, in the third photolithography step, only parts of the oxide semiconductor layers 431 and 432 are etched, whereby oxide semiconductor layers having grooves (depressed portions) are formed in some cases. The resist mask used for forming the source electrode layer 415a, the drain electrode layer 415b, the source electrode layer 425a, and the drain electrode layer 425b may be formed by an ink-jet method. Formation of the resist mask by an ink-jet method needs no photomask; thus, manufacturing cost can be reduced.

In order to reduce the number of photomasks used in a photolithography step and reduce the number of photolithography steps, an etching step may be performed using a resist mask formed with the use of a multi-tone mask which is a light-exposure mask through which light is transmitted to have a plurality of intensities. The resist mask formed with the use of a multi-tone mask has a plurality of thicknesses and further can be changed in shape by etching; therefore, the resist mask can be used in a plurality of etching steps for processing into different patterns. Therefore, a resist mask corresponding to at least two kinds or more of different patterns can be formed by one multi-tone mask. Thus, the number of light-exposure masks can be reduced and the number of corresponding photolithography steps can be also reduced, whereby simplification of a process can be realized.

Next, plasma treatment is performed thereon, using a gas such as $N_2O$, $N_2$, or Ar. By this plasma treatment, adsorbed water and the like attached to an exposed surface of the oxide semiconductor layers are removed. Plasma treatment may be performed using a mixture gas of oxygen and argon as well.

After the plasma treatment, the oxide insulating layer 416 which serves as a protective insulating film and is in contact with parts of the oxide semiconductor layers is formed without exposure to the air.

The oxide insulating layer 416 has a thickness of at least 1 nm and can be formed by a method by which an impurity such as water or hydrogen does not enter the oxide insulating layer 416, such as a sputtering method, as appropriate. When hydrogen is contained in the oxide insulating layer 416, entry of the hydrogen to the oxide semiconductor layers or abstraction of oxygen in the oxide semiconductor layers by the hydrogen is caused, thereby making the backchannels of the oxide semiconductor layers have a lower resistance (have an n-type conductivity) and forming parasitic channels. Therefore, it is important that a film formation method in which hydrogen be not used is employed in order to form the oxide insulating layer 416 containing as little hydrogen as possible.

In this embodiment, a silicon oxide film is formed to a thickness of 200 nm as the oxide insulating layer 416 by a sputtering method. The substrate temperature in film formation may be higher than or equal to room temperature and lower than or equal to 300° C. and in this embodiment, is 100° C. The formation of the silicon oxide film by a sputtering method can be performed in a rare gas (typically argon) atmosphere, an oxygen atmosphere, or an atmosphere of a rare gas (typically argon) and oxygen. As a target, a silicon oxide target or a silicon target may be used. For example, with the use of a silicon target, silicon oxide can be formed by a sputtering method under an atmosphere of oxygen and nitrogen. As the oxide insulating layer 416 which is formed in contact with the oxide semiconductor layer whose resistance is reduced, an inorganic insulating film which does not include impurities such as moisture, a hydrogen ion, and $OH^-$ and blocks entry of these from the outside is used. Typically, a silicon oxide film, a silicon nitride oxide film, an aluminum oxide film, or an aluminum oxynitride film is used.

Next, second heat treatment is performed in an inert gas atmosphere or an oxygen gas atmosphere (preferably at 200 to 400° C. inclusive, e.g. 250 to 350° C. inclusive). For example, the second heat treatment is performed in a nitrogen atmosphere at 250° C. for one hour. In the second heat treatment, part of the oxide semiconductor layers (channel formation region) is heated while in contact with the oxide insulating layer 416.

Through the steps, heat treatment for dehydration or dehydrogenation is performed on the deposited oxide semiconductor film to reduce the resistance of the oxide semiconductor film, and then, part of the oxide semiconductor film is selectively made to be in an oxygen-excess state. As a result, the channel formation region 413 overlapping with the gate electrode layer 411 becomes i-type, and a high-resistance source region 414a which overlaps with the source electrode layer 415a and a high-resistance drain region 414b which overlaps with the drain electrode layer 415b are formed in a self-aligned manner. Thus, the thin film transistor 410 is formed. Similarly, the channel formation region 423 overlapping with the gate electrode layer 421 becomes i-type, and the high-resistance source region 424a overlapping with the source electrode layer 425a and the high-resistance drain region 424b overlapping with the drain electrode layer 425b are formed in a self-aligned manner. Through the above-described steps, the thin film transistor 420 is formed.

When an impurity is in an oxide semiconductor, in the bias temperature test (BT test) at 85° C. for 12 hours with electric field strength of $2\times10^6$ V/cm, a combination between the impurity and the main component of the oxide semiconductor is cut by a strong electric field (B: bias) and a high temperature (T: temperature), and a generated dangling bond leads to a shift in the threshold voltage (Vth). On the other hand, by removing impurities in an oxide semiconductor, especially hydrogen or water, and giving good interface characteristics between an insulating film and an oxide semiconductor as described above, a transistor which is stable even in the BT test can be provided.

Heat treatment may be further performed at 100° C. to 200° C. inclusive in the air for 1 hour to 30 hours inclusive. In this embodiment, the heat treatment is performed at 150° C. for 10 hours. This heat treatment may be performed at a fixed heating temperature. Alternatively, the following change in the heating temperature may be conducted plural times repeatedly: the heating temperature is increased from a room temperature to a temperature of 100° C. to 200° C. inclusive and then decreased to a room temperature. Further, this heat treatment may be performed before formation of the oxide insulating film under a reduced pressure. Under the reduced pressure, the heat treatment time can be shortened. With such heat treatment, hydrogen is introduced from the oxide semiconductor layers to the oxide insulating layer; thus, normally-off thin film transistors can be obtained. Therefore, reliability of the liquid crystal display device can be improved.

Note that by forming the high-resistance drain regions 414b and 424b (or the high-resistance source regions 414a and 424a) in the oxide semiconductor layers overlapping with the drain electrode layers 415b and 425b (and the source electrode layers 415a and 425a), reliability of the thin film transistors can be improved. Specifically, by forming the high-resistance drain regions 414b and 424b, the structure can be obtained in which conductivities of the drain electrode layers 415b and 425b, the high-resistance drain regions 414b and 424b, and the channel formation regions 413 and 423 vary stepwise. Thus, in the case where operation is performed with the drain electrode layers 415b and 425b which are connected to a wiring for supplying a high power supply potential $V_{dd}$, the high-resistance drain region serves as a buffer, and thus local concentration of an electric field is not apt to occur even if high voltage is applied between the gate electrode layer 411 and the drain electrode layer 415b and between the gate electrode layer 421 and the drain electrode layer 425b, which leads to an increase in the withstand voltage of the transistors.

Further, the high-resistance source region or the high-resistance drain region in the oxide semiconductor layer is formed in the entire thickness direction in the case where the thickness of the oxide semiconductor layer is 15 nm or smaller. In the case where the thickness of the oxide semiconductor layer is 30 nm or larger and 50 nm or smaller, in part of the oxide semiconductor layer, that is, in a region in the oxide semiconductor layer which is in contact with the source electrode layer or the drain electrode layer and the vicinity thereof, resistance is reduced and a high-resistance source region or a high-resistance drain region is formed, while a region in the oxide semiconductor layer, which is close to the gate insulating film, can be made to be an I type.

A protective insulating layer may be further formed over the oxide insulating layer 416. For example, a silicon nitride film is formed by an RF sputtering method. Since an RF sputtering method has high productivity, it is preferably used as a film formation method of the protective insulating layer. As the protective insulating layer, an inorganic insulating film which does not include impurities such as moisture, a hydrogen ion, and OH⁻ and blocks entry of these from the outside is used. Specifically, a silicon nitride film, an aluminum nitride film, a silicon nitride oxide film, an aluminum oxynitride film, or the like is used. In this embodiment, a protective insulating layer 403 is formed using a silicon nitride film as the protective insulating layer (see FIG. 5D).

Figure 5E:
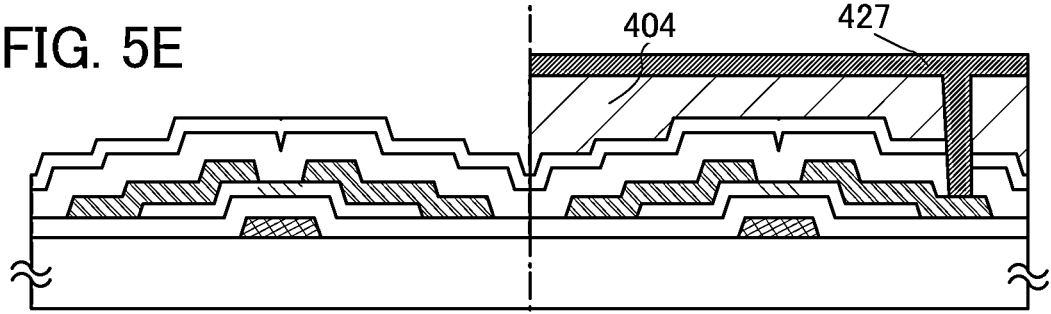

A planarization insulating layer for planarization may be provided over the protective insulating layer 403. As illustrated in FIG. 5E, a planarization insulating layer 404 is formed over the protective insulating layer 403 over the thin film transistor 420.

The planarization insulating layer 404 can be formed from an organic material having heat resistance, such as polyimide, acrylic, benzocyclobutene, polyamide, or epoxy. Other than such organic materials, it is also possible to use a low-dielectric constant material (a low-k material), a siloxane-based resin, PSG (phosphosilicate glass), BPSG (borophosphosilicate glass), or the like. The planarization insulating layer 404 may be formed by stacking a plurality of insulating films formed using these materials.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. In addition, the organic group may include a fluoro group.

The formation method of the planarization insulating layer 404 is not limited to a particular method, and the following method can be used depending on the material: a sputtering method, an SOG method, a spin coating method, a dipping method, a spray coating method, a droplet discharge method (an ink-jet method, screen printing, offset printing, or the like), or the like. Further, the planarization insulating layer 404 can be formed with a doctor knife, a roll coater, a curtain coater, a knife coater, or the like.

Next, a fourth photolithography step is performed. A resist mask is formed and etching is performed selectively to remove part of the oxide insulating layer 416, part of the protective insulating layer 403, and part of the planarization insulating layer 404, so that an opening reaching the drain electrode layer 425b is formed.

Then, a light-transmitting conductive film is formed. The light-transmitting conductive film is formed using indium oxide ($In_2O_3$), an alloy of indium oxide and tin oxide ($In_2O_3$—$SnO_2$, abbreviated as ITO), or the like by a sputtering method, a vacuum evaporation method, or the like. An Al—Zn—O-based non-single-crystal film, examples of which are an Al—Zn—O—N-based non-single-crystal film, a Zn—O-based non-single-crystal film containing nitrogen, and a Sn—Zn—O-based non-single-crystal film containing nitrogen, may also be used as the light-transmitting conductive film. Note that the composition ratio (atomic %) of zinc in the Al—Zn—O—N-based film is less than or equal to 47 atomic % and is higher than that of aluminum in the film; the composition ratio (atomic %) of aluminum in the film is higher than that of nitrogen in the film. Such a material is etched with a hydrochloric acid-based solution. However, since a residue is easily generated particularly in etching ITO, indium oxide-zinc oxide alloy ($In_2O_3$—$ZnO$) may be used to improve etching processability.

Note that the unit of the percentage of components in the light-transmitting conductive film is atomic percent, and the percentage of components is evaluated by analysis using an electron probe X-ray microanalyzer (EPMA).

Next, a fifth photolithography step is performed. A resist mask is formed, and an unnecessary portion of the light-transmitting conductive film is removed by etching to form a pixel electrode 427. Then, the resist mask is removed (see FIG. 5E).

In this embodiment, the step of forming the opening in the gate insulating layer is not illustrated in a drawing; however, the step of forming an opening in the gate insulating layer may be performed in either the same photolithography step as that of the oxide insulating layer and the protective insulating layer or another photolithography step. When the opening is formed in another photolithography step, the number of photolithography steps is six.

The liquid crystal display device including the thin film transistor formed using the oxide semiconductor layer which is described in this embodiment is combined with the structure described in Embodiment 1, whereby low power consumption can be achieved and image distortion can be reduced in displaying a still image.

This embodiment can be implemented in appropriate combination with any of the other embodiments.

(Embodiment 4)

In this embodiment, another example of thin film transistors applicable to the liquid crystal display device disclosed in this specification is described. A thin film transistor 240 and a thin film transistor 260 to be described in this embodiment can be used as the switching transistor 1261 and the pixel transistor 1211 in Embodiment 2, respectively.

An embodiment of a liquid crystal display device of this embodiment and a manufacturing method of the liquid crystal display device is described with reference to FIGS. 6A to 6E.

Although description is given using single-gate thin film transistors as the thin film transistors 240 and 260, multi-gate thin film transistors each including a plurality of channel formation regions may be formed as needed.

A process of manufacturing the thin film transistors 240 and 260 over a substrate 290 is described with reference to FIGS. 6A to 6E.

First, a conductive film is formed over the substrate 290 having an insulating surface, and then, gate electrode layers 241 and 261 are formed in a first photolithography step. In this embodiment, a tungsten film is formed to a thickness of 150 nm by a sputtering method, for the gate electrode layers 241 and 261.

Next, a gate insulating layer 292 is formed over the gate electrode layers 241 and 261. In this embodiment, a silicon oxynitride layer is formed to a thickness of 100 nm or less by a plasma CVD method as the gate insulating layer 292.

Next, a metal conductive film is formed over the gate insulating layer 292, and a second photolithography step is performed. A resist mask is formed over the metal conductive film and selective etching is performed, whereby source electrode layers 245a and 265a and drain electrode layers 245b and 265b are formed. Then, the resist mask is removed (see FIG. 6A).

Figure 6A:
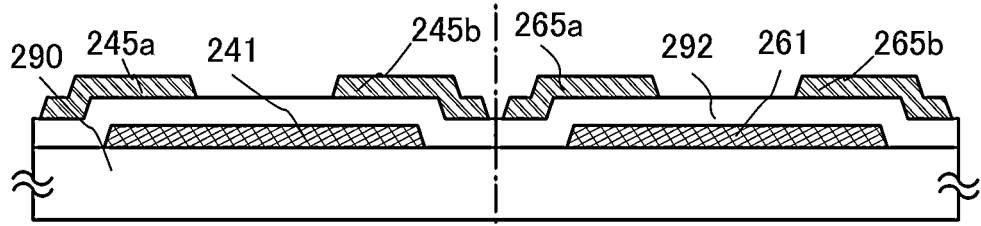
FIGS. 6A to 6E illustrate cross sections of thin film transistors of Embodiment 4.
Figure 6B:
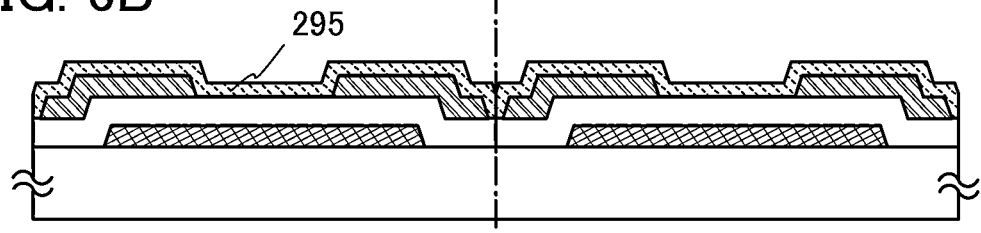

Next, an oxide semiconductor film 295 is formed (see FIG. 6B). In this embodiment, the oxide semiconductor film 295 is formed by a sputtering method with the use of an In—Ga—Zn—O-based oxide semiconductor target. The oxide semiconductor film 295 is processed into island-like oxide semiconductor layers in a third photolithography step.

Figure 6C:
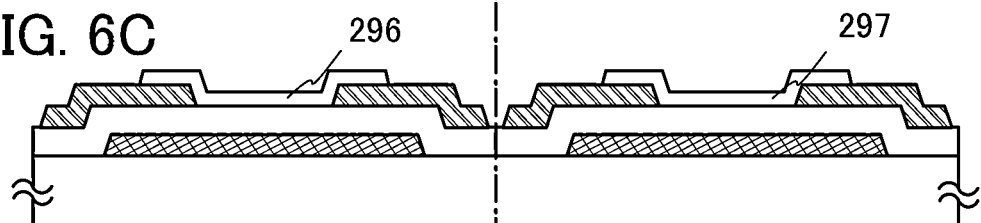
Figure 6D:
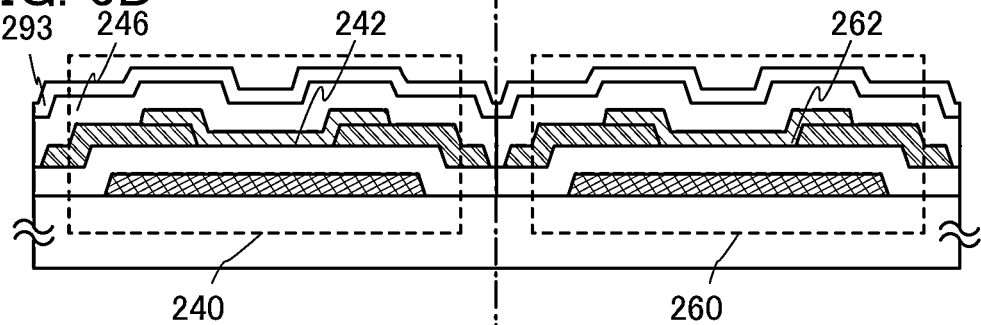

Next, dehydration or dehydrogenation of the oxide semiconductor layers is performed. The temperature of first heat treatment for dehydration or dehydrogenation is higher than or equal to 400° C. and lower than or equal to 750° C., preferably higher than or equal to 400° C. and lower than the strain point of the substrate. In this embodiment, the substrate is introduced into an electric furnace, which is one of heat treatment apparatuses, and heat treatment is performed on the oxide semiconductor layers in a nitrogen atmosphere at 450° C. for one hour. Then, the oxide semiconductor layers are not exposed to the air, so that entry of water and hydrogen into the oxide semiconductor layers is prevented. Thus, oxide semiconductor layers 296 and 297 are obtained (FIG. 6C).

For example, as the first heat treatment, GRTA by which the substrate is moved into an inert gas heated to a high temperature as high as 650° C. to 700° C., heated for several minutes, and moved out of the inert gas heated to the high temperature may be performed. With GRTA, high-temperature heat treatment for a short period of time can be achieved.

An oxide insulating layer 246 to be a protective insulating film is formed in contact with the oxide semiconductor layers 296 and 297.

The oxide insulating layer 246 has a thickness of at least 1 nm and can be formed by a method by which an impurity such as water or hydrogen does not enter the oxide insulating layer 246, such as a sputtering method, as appropriate. When hydrogen is contained in the oxide insulating layer 246, entry of the hydrogen to the oxide semiconductor layers or abstraction of oxygen in the oxide semiconductor layers by the hydrogen is caused, thereby making regions of the oxide semiconductor layers which are in contact with the oxide insulating layer 246 have a lower resistance (have an n-type conductivity) and forming parasitic channels. Therefore, it is important that a film formation method in which hydrogen is not used be employed in order to form the oxide insulating layer 246 containing as little hydrogen as possible.

In this embodiment, a silicon oxide film is formed to a thickness of 200 nm as the oxide insulating layer 246 by a sputtering method. The substrate temperature in film formation may be higher than or equal to room temperature and lower than or equal to 300° C. and in this embodiment, is 100° C. The formation of the silicon oxide film by a sputtering method can be performed in a rare gas (typically argon) atmosphere, an oxygen atmosphere, or an atmosphere of a rare gas (typically argon) and oxygen. As a target, a silicon oxide target or a silicon target may be used. For example, with the use of a silicon target, silicon oxide can be formed by a sputtering method under an atmosphere of oxygen and nitrogen. As the oxide insulating layer 246 which is formed in contact with the oxide semiconductor layer whose resistance is reduced, an inorganic insulating film which does not include impurities such as moisture, a hydrogen ion, and OH⁻ and blocks entry of these from the outside is used. Typically, a silicon oxide film, a silicon nitride oxide film, an aluminum oxide film, or an aluminum oxynitride film is used.

Next, second heat treatment is performed in an inert gas atmosphere or an oxygen gas atmosphere (preferably at 200 to 400° C. inclusive, e.g. 250 to 350° C. inclusive). For example, the second heat treatment is performed in a nitrogen atmosphere at 250° C. for one hour. In the second heat treatment, parts of the oxide semiconductor layers (channel formation region) are heated while in contact with the oxide insulating layer 246.

Through the steps, heat treatment for dehydration or dehydrogenation is performed on the deposited oxide semiconductor film to reduce the resistance of the oxide semiconductor film, and then, part of the oxide semiconductor film is selectively made to be in an oxygen-excess state. As a result, i-type oxide semiconductor layers 242 and 262 are formed. Thus, the thin film transistors 240 and 260 are formed.

Heat treatment may be further performed at 100° C. to 200° C. inclusive in the air for 1 hour to 30 hours inclusive. In this embodiment, the heat treatment is performed at 150° C. for 10 hours. This heat treatment may be performed at a fixed heating temperature. Alternatively, the following change in the heating temperature may be conducted plural times repeatedly: the heating temperature is increased from a room temperature to a temperature of 100° C. to 200° C. inclusive and then decreased to a room temperature. Further, this heat treatment may be performed before formation of the oxide insulating film under a reduced pressure. Under the reduced pressure, the heat treatment time can be shortened. With such heat treatment, hydrogen is introduced from the oxide semiconductor layers to the oxide insulating layer; thus, normally-off thin film transistors can be obtained. Therefore, reliability of the liquid crystal display device can be improved.

A protective insulating layer may be further formed over the oxide insulating layer 246. For example, a silicon nitride film is formed by an RF sputtering method. In this embodiment, a protective insulating layer 293 is formed using a silicon nitride film (see FIG. 6D).

Figure 6E:
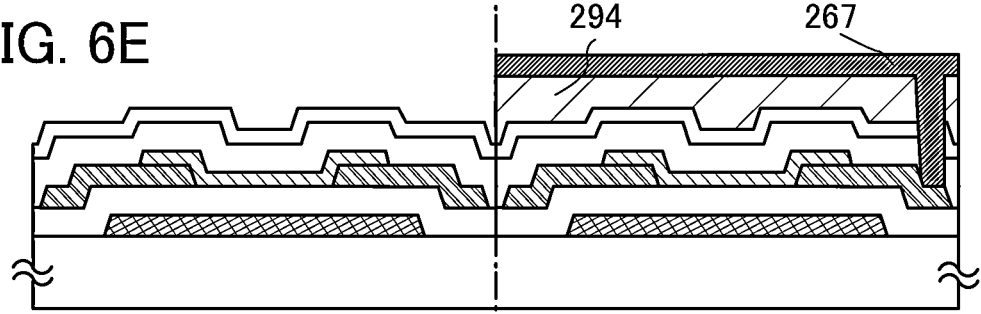

A planarization insulating layer for planarization may be provided over the protective insulating layer 293. In this embodiment, as illustrated in FIG. 6E, a planarization insulating layer 294 is formed over the protective insulating layer 293 over the thin film transistor 260.

Next, a fourth photolithography step is performed. A resist mask is formed and etching is performed selectively to remove part of the planarization insulating layer 294, part of the protective insulating layer 293, and part of the oxide insulating layer 246, so that an opening reaching the drain electrode layer 265b is formed.

Next, a light-transmitting conductive film is formed, and a fifth photolithography step is performed. A resist mask is formed, and an unnecessary portion is removed by etching to form a pixel electrode 267. Then, the resist mask is removed (see FIG. 6E).

In this embodiment, the step of forming the opening in the gate insulating layer is not illustrated in a drawing; however, the step of forming an opening in the gate insulating layer may be performed in either the same photolithography step as that of the oxide insulating layer and the protective insulating layer or another photolithography step. When the opening is formed in another photolithography step, the number of photolithography steps is six.

The liquid crystal display device including the thin film transistor formed using the oxide semiconductor layer which is described in this embodiment is combined with the structure described in Embodiment 1, whereby low power consumption can be achieved and image distortion can be reduced in displaying a still image.

This embodiment can be implemented in appropriate combination with any of the other embodiments.

(Embodiment 5)

In this embodiment, an example of thin film transistors applicable to the liquid crystal display device disclosed in this specification is described. A thin film transistor 470 and a thin film transistor 480 to be described in this embodiment can be used as the switching transistor 1261 and the pixel transistor 1211 in Embodiment 2, respectively.

Figure 7:
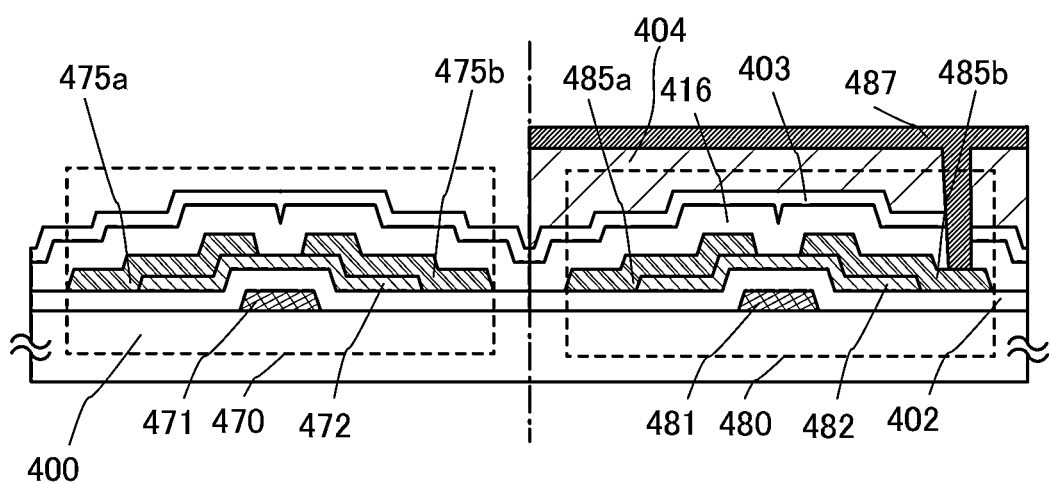
FIG. 7 illustrates a cross section of thin film transistors of Embodiment 5.

In this embodiment, an example of a manufacturing process of a thin film transistor, which is different from that in Embodiment 3, will be described with reference to FIG. 7. Since a process part of which is illustrated in FIG. 7 is the same as that of FIGS. 5A to 5E except for part of steps, the same portions are denoted by the same reference numerals and detailed description of the same portions is omitted.

In accordance with Embodiment 1, gate electrode layers 471 and 481 are formed over the substrate 400 and the gate insulating layer 402 is stacked thereover.

Next, an oxide semiconductor film is formed, and is processed into island-shaped oxide semiconductor layers in a photolithography step.

Next, dehydration or dehydrogenation of the oxide semiconductor layers is performed. The temperature of first heat treatment for dehydration or dehydrogenation is set at higher than or equal to 400° C., preferably 425° C. or higher. Note that in the case where the temperature is 425° C. or higher, the heat treatment time may be one hour or shorter, whereas in the case where the temperature is lower than 425° C., the heat treatment time is longer than one hour. In this embodiment, the substrate is introduced into an electric furnace, which is one of heat treatment apparatuses, and heat treatment is performed on the oxide semiconductor layers in a nitrogen atmosphere. Then, the oxide semiconductor layers are not exposed to the air, so that entry of water and hydrogen into the oxide semiconductor layers is prevented. Thus, the oxide semiconductor layers are obtained. After that, cooling is performed by introduction of a high-purity oxygen gas, a high-purity $N_2O$ gas, or ultra-dry air (having a dew point of −40° C. or lower, preferably −60° C. or lower) into the same furnace. It is preferable that the oxygen gas and the $N_2O$ gas do not include water, hydrogen, and the like. Further, the purity of an oxygen gas or a $N_2O$ gas which is introduced into the heat treatment apparatus is preferably 6N (99.9999%) or more, still preferably 7N (99.99999%) or more (i.e., the impurity concentration of the oxygen gas or the $N_2O$ gas is preferably 1 ppm or lower, still preferably 0.1 ppm or lower).

The heat treatment apparatus is not limited to the electric furnace, and for example may be an RTA (rapid thermal annealing) apparatus such as a GRTA (gas rapid thermal annealing) apparatus or an LRTA (lamp rapid thermal annealing) apparatus. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. In addition, the LRTA apparatus may be provided with not only a lamp but also a device which heats an object to be processed by heat conduction or heat radiation from a heater such as a resistance heater. GRTA is a method of heat treatment using a high-temperature gas. As the gas, an inert gas which does not react with an object to be processed by heat treatment, such as nitrogen or a rare gas such as argon is used. The heat treatment may be performed at 600° C. to 750° C. for several minutes using an RTA method.

Further, after the first heat treatment for dehydration or dehydrogenation, heat treatment may be performed at 200° C. to 400° C. inclusive, preferably 200° C. to 300° C. inclusive, in an atmosphere of an oxygen gas or an $N_2O$ gas.

The first heat treatment for the oxide semiconductor layers can be performed on the oxide semiconductor film which has not yet been processed into the island-shaped oxide semiconductor layers. In that case, the substrate is taken out from the heat apparatus after the first heat treatment, and then a photolithography step is performed.

The entire oxide semiconductor film is made to contain an excess amount of oxygen through the steps, whereby the oxide semiconductor film has higher resistance, that is, becomes i-type. Accordingly, oxide semiconductor layers 472 and 482 whose entire regions are i-type are formed.

Next, a resist mask is formed by a photolithography step over the oxide semiconductor layers 472 and 482, and etching is performed selectively to form source electrode layers 475*a* and 485*a* and drain electrode layers 475*b* and 485*b*, and then, an oxide insulating layer 416 is formed by a sputtering method. Thus, the thin film transistors 470 and 480 can be formed.

Next, in order to reduce variation in electric characteristics of the thin film transistor, heat treatment is performed in an inert gas atmosphere or a nitrogen gas atmosphere (preferably at 150° C. or higher and lower than 350° C.). For example, the heat treatment is performed in a nitrogen atmosphere at 250° C. for one hour.

Heat treatment may be further performed at 100° C. to 200° C. inclusive in the air for 1 hour to 30 hours inclusive. In this embodiment, the heat treatment is performed at 150° C. for 10 hours. This heat treatment may be performed at a fixed heating temperature. Alternatively, the following change in the heating temperature may be conducted plural times repeatedly: the heating temperature is increased from a room temperature to a temperature of 100° C. to 200° C. inclusive and then decreased to a room temperature. Further, this heat treatment may be performed before formation of the oxide insulating film under a reduced pressure. Under the reduced pressure, the heat treatment time can be shortened. With such heat treatment, hydrogen is introduced from the oxide semiconductor layers to the oxide insulating layer; thus, normally-off thin film transistors can be obtained. Therefore, reliability of the liquid crystal display device can be improved.

The protective insulating layer 403 is formed over the oxide insulating layer 416. In this embodiment, the protective insulating layer 403 is formed using a silicon nitride film as the protective insulating layer.

A planarizing insulating layer for planarization may be provided over the protective insulating layer 403. In this embodiment, as illustrated in FIG. 7, the planarization insulating layer 404 is formed over the protective insulating layer 403 over the thin film transistor 480.

Next, a photolithography step is performed. A resist mask is formed and etching is performed selectively to remove part of the planarization insulating layer 404, part of the protective insulating layer 403, and part of the oxide insulating layer 416, so that an opening reaching the drain electrode layer 485*b* is formed.

Next, a light-transmitting conductive film is formed, and a photolithography step is performed. A resist mask is formed and an unnecessary portion is removed by etching to form a pixel electrode 487. Then, the resist mask is removed (see FIG. 7).

The liquid crystal display device including the thin film transistor formed using the oxide semiconductor layer which is described in this embodiment is combined with the structure described in Embodiment 1, whereby low power consumption can be achieved and image distortion can be reduced in displaying a still image.

This embodiment can be implemented in appropriate combination with any of the other embodiments.

(Embodiment 6)

In this embodiment, examples of electronic appliances each including the liquid crystal display device described in any of the embodiments are described.

Figure 8A:
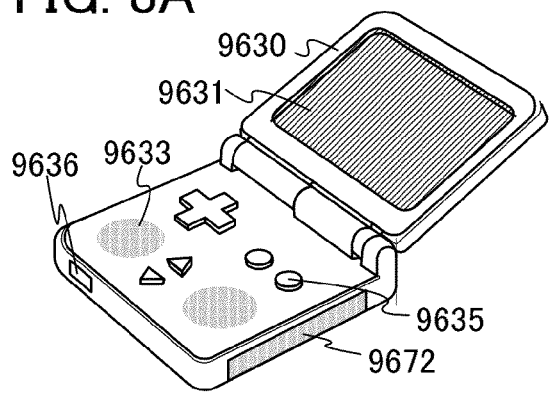
FIGS. 8A to 8C illustrate electronic appliances.

FIG. 8A illustrates a portable game machine which can include a housing 9630, a display portion 9631, speakers 9633, operation keys 9635, a connection terminal 9636, a recording medium reading portion 9672, and the like. The portable game machine illustrated in FIG. 8A can have a function of reading a program or data stored in a recording medium to display on the display portion; a function of sharing information by wireless communication with another portable game machine; and the like. The portable game machine in FIG. 8A can have various functions without limitation to the above.

Figure 8B:
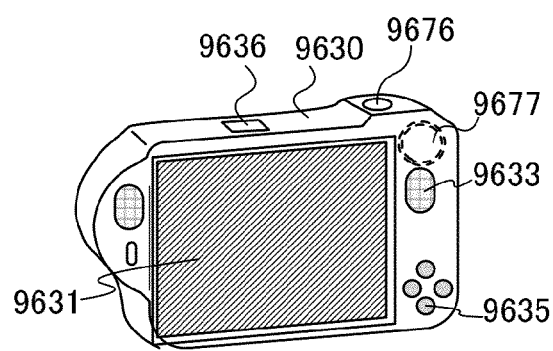

FIG. 8B illustrates a digital camera which can include a housing 9630, a display portion 9631, a speaker 9633, operation keys 9635, a connection terminal 9636, a shutter button 9676, an image receiving portion 9677, and the like. The digital camera having a television reception function illustrated in FIG. 8B can have various functions such as a function of photographing a still image and a moving image; a function of automatically or manually adjusting the photographed image; a function of obtaining various kinds of information from an antenna; a function of storing the photographed image or the information obtained from the antenna; and a function of displaying the photographed image or the information obtained from the antenna on the display portion. Note that the functions of the digital camera having the television reception function illustrated in FIG. 8B are not limited to those, and the digital camera having the television reception function can have other various functions.

Figure 8C:
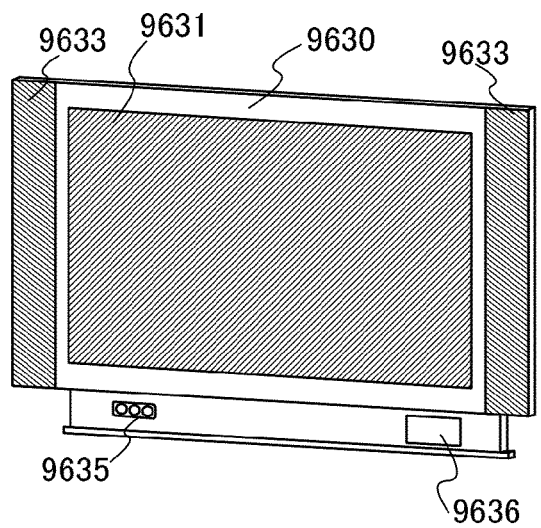

FIG. 8C illustrates a television receiver which can include a housing 9630, a display portion 9631, speakers 9633, operation keys 9635, a connection terminal 9636, and the like. The television set shown in FIG. 8C has a function of processing an electric wave for television and converting the electric wave into an image signal, a function of processing the image signal and converting the image signal into a signal suitable for display, a function of converting a frame frequency of the image signal, and the like. Note that the television set shown in FIG. 8C can have a variety of functions without being limited to the above.

Figure 9A:
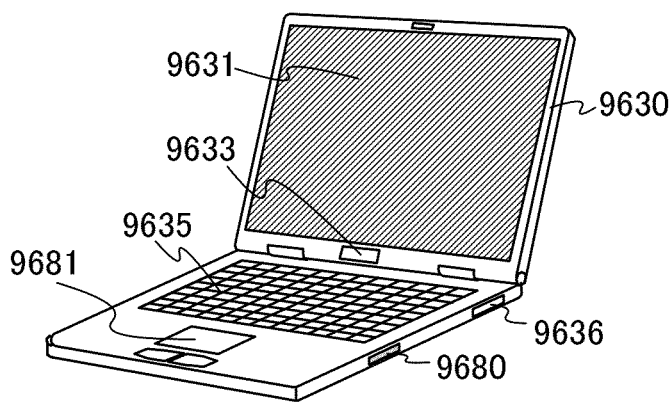
FIGS. 9A to 9C illustrate electronic appliances.

FIG. 9A illustrates a computer which can include a housing 9630, a display portion 9631, a speaker 9633, operation keys 9635, a connection terminal 9636, a pointing device 9681, and the like. The computer illustrated in FIG. 9A can have a function of displaying a variety of information (e.g., a still image, a moving image, and a text image) on the display portion; a function of controlling processing by a variety of software (programs); a communication function such as wireless communication or wire communication; a function of connecting to various computer networks by using the communication function; a function of transmitting or receiving a variety of data by using the communication function; and the like. Note that the functions of the computer illustrated in FIG. 9A are not limited to those, and the computer can have other various functions.

Figure 9B:
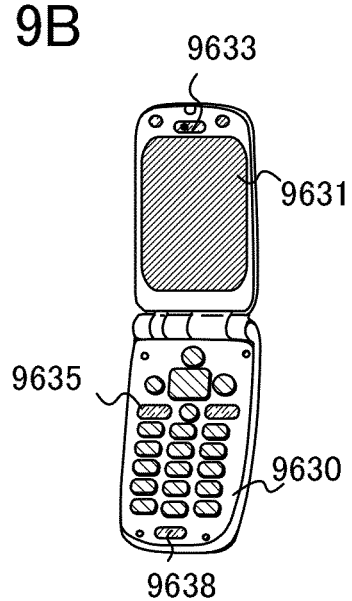

FIG. 9B illustrates a mobile phone which can include a housing 9630, a display portion 9631, a speaker 9633, operation keys 9635, a microphone 9638, an external connecting port 9680, and the like. The mobile phone shown in FIG. 9B can have a function of displaying a variety of information (e.g., a still image, a moving image, and a text image) on the display portion; a function of displaying a calendar, a date, the time, and the like on the display portion; a function of operating or editing the information displayed on the display portion; a function of controlling processing by various kinds of software (programs); and the like. Note that the mobile phone shown in FIG. 9B is not limited to having these functions, and can have various functions.

Figure 9C:
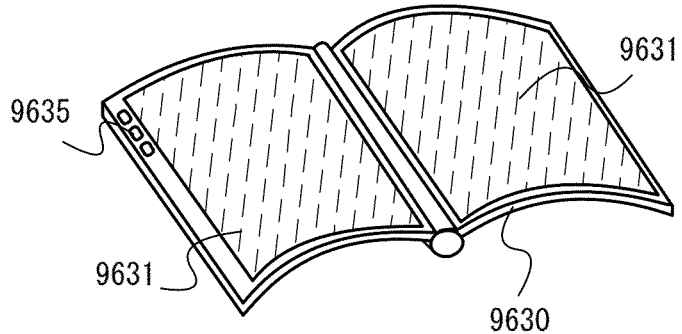

FIG. 9C illustrates a device which can include electronic paper (also referred to as an eBook or an e-book reader) that can include a housing 9630, a display portion 9631, an operation key 9635, and the like. The e-book reader in FIG. 9C can have a function of displaying a variety of information (e.g., a still image, a moving image, and a text image) on the display portion; a function of displaying a calendar, a date, the time, and the like on the display portion; a function of operating or editing the information displayed on the display portion; a function of controlling processing by various kinds of software (programs); and the like. Note that the e-book reader in FIG. 9C can have a variety of functions without being limited to the above.

In the electronic appliances described in this embodiment, low power consumption can be achieved and image distortion can be reduced in displaying a still image.

This embodiment can be implemented in appropriate combination with any of the structures described in the other embodiments.

(Embodiment 7)

In this embodiment, a principle of operation of a bottom-gate transistor including an oxide semiconductor will be described.

Figure 10:
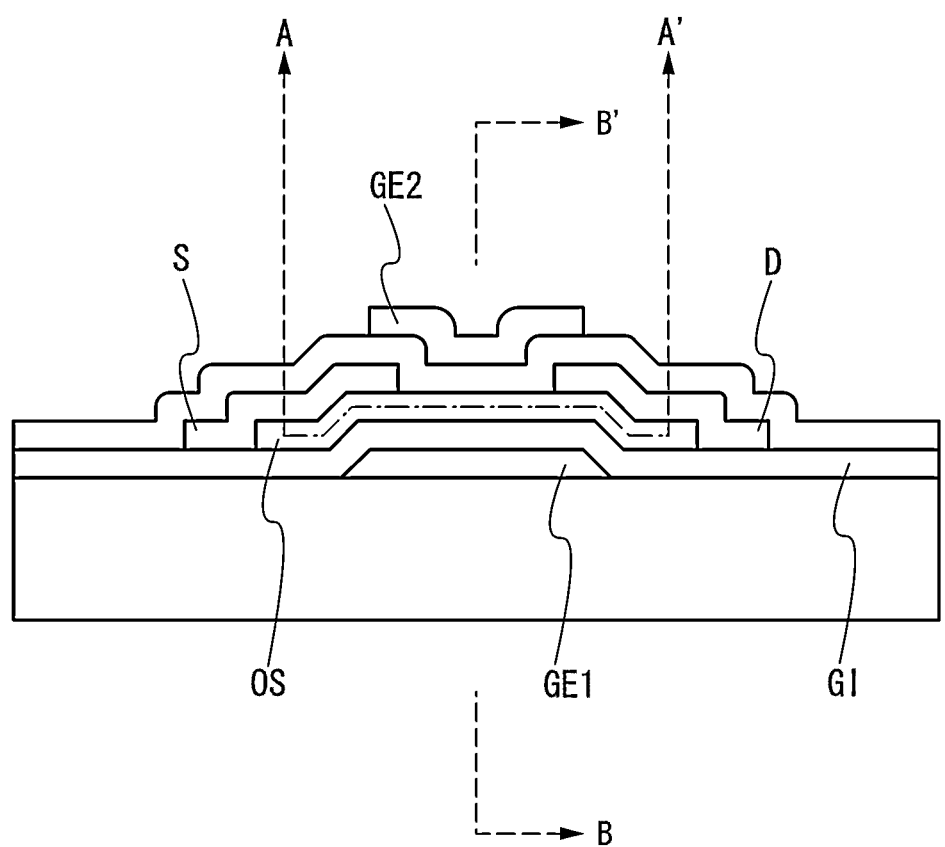
FIG. 10 is a diagram for illustrating Embodiment 7.

FIG. 10 is a cross-sectional view of an inverted-staggered insulated-gate transistor including an oxide semiconductor. An oxide semiconductor layer (OS) is provided over a gate electrode (GE1) with a gate insulating film (GI) interposed therebetween, and a source electrode (S) and a drain electrode (D) are provided thereover.

Figure 11A:
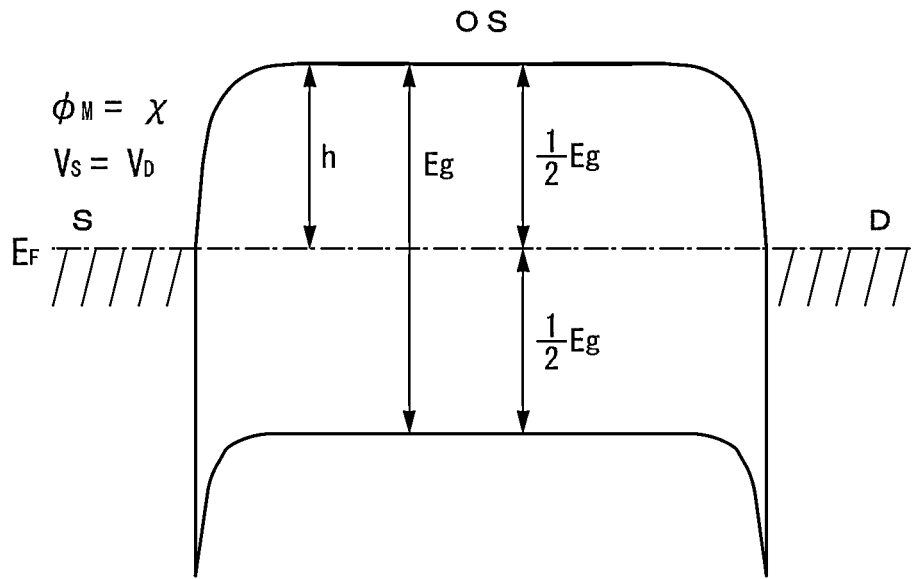
FIGS. 11A and 11B are diagrams for illustrating Embodiment 7.
Figure 11B:
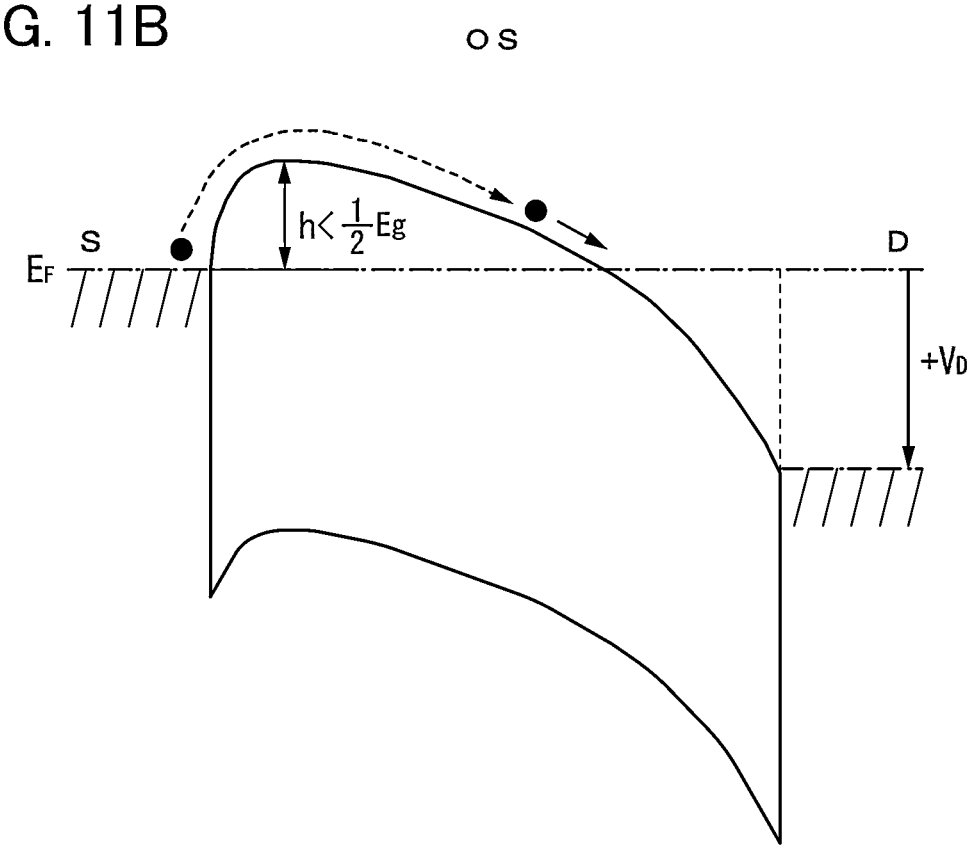

FIGS. 11A and 11B are energy band diagrams (schematic diagrams) along an A-A' section illustrated in FIG. 10. FIG. 11A illustrates the case where the potential of a voltage applied to the source is equal to the potential of a voltage applied to the drain (VD=0 V), and FIG. 11B illustrates the case where a positive potential with respect to the source is applied to the drain (VD>0).

FIGS. 12A and 12B are energy band diagrams (schematic diagrams) along a B-B' section illustrated in FIG. 10. FIG. 12A illustrates an on state in which a positive potential (+VG) is applied to the gate (G1) and carriers (electrons) flow between the source and the drain. FIG. 12B illustrates an off state in which a negative potential (−VG) is applied to the gate (G1) and minority carriers do not flow.

Figure 13:
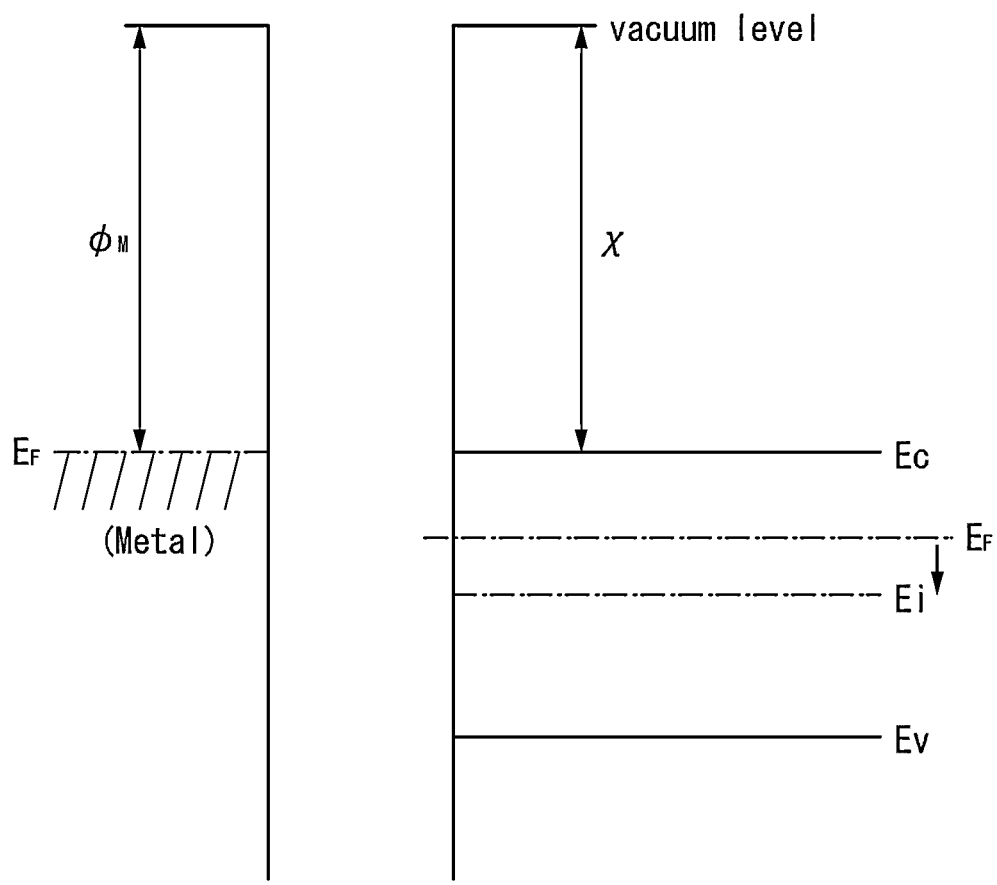
FIG. 13 is a diagram for illustrating Embodiment 7.

FIG. 13 illustrates the relationships between the vacuum level and the work function of a metal ($\phi M$) and between the vacuum level and the electron affinity ($\chi$) of an oxide semiconductor.

Electrons in a metal are degenerated at room temperature, so that the Fermi level is located in the conduction band. In contrast, a conventional oxide semiconductor is generally of n-type, and the Fermi level ($E_f$) in that case is located closer to the conduction band and is away from the intrinsic Fermi level ($E_i$) that is located in the middle of the band gap. It is known that some of hydrogen in the oxide semiconductor serves as donors, and is one factor causing an oxide semiconductor to be an n-type.

On the other hand, an oxide semiconductor of the present invention is an intrinsic (i-type) or a substantially intrinsic oxide semiconductor which is obtained by removing hydrogen that is an n-type impurity from an oxide semiconductor and purifying the oxide semiconductor such that an impurity other than a main component of the oxide semiconductor is prevented from being contained therein as much as possible. In other words, a feature is that a purified i-type (intrinsic) semiconductor, or a semiconductor close thereto, is obtained not by adding an impurity but by removing an impurity such as hydrogen or water as much as possible. This enables the Fermi level ($E_f$) to be at the same level as the intrinsic Fermi level ($E_i$).

In the case where the band gap (Eg) of an oxide semiconductor is 3.15 eV, the electron affinity ($\chi$) is said to be 4.3 eV. The work function of titanium (Ti) included in the source electrode and the drain electrode is substantially equal to the electron affinity ($\chi$) of the oxide semiconductor. In that case, a Schottky barrier for electrons is not formed at an interface between the metal and the oxide semiconductor.

In other words, in the case where the work function of metal ($\phi M$) and the electron affinity ($\chi$) of the oxide semiconductor are equal to each other and the metal and the oxide semiconductor are in contact with each other, an energy band diagram (a schematic diagram) as illustrated in FIG. 11A is obtained.

In FIG. 11B, a black circle (●) represents an electron, and when a positive potential is applied to the drain, the electron is injected into the oxide semiconductor over the barrier (h) and flows toward the drain. In that case, the height of the barrier (h) changes depending on the gate voltage and the drain voltage; in the case where a positive drain voltage is applied, the height of the barrier (h) is smaller than the height of the barrier in FIG. 11A where no voltage is applied, i.e., ½ of the band gap (Eg).

The electron injected into the oxide semiconductor at this time flows in the oxide semiconductor as illustrated in FIG. 12A. In addition, in FIG. 12B, when a negative potential is applied to the gate electrode (G1), the value of current is extremely close to zero because holes that are minority carriers are substantially zero.

For example, even when an insulated-gate transistor as described above has a channel width W of $1 \times 10^4$ µm and a channel length of 3 µm, the off-state current is $10^{-13}$ A or less and the subthreshold swing (S value) is 0.1 V/dec (the thickness of the gate insulating film: 100 nm).

Note that the intrinsic carrier density of a silicon semiconductor is $1.45 \times 10^{10}/cm^3$ (300 K) and carriers exist even at room temperature. This means that thermally excited carriers exist even at room temperature. A silicon wafer to which an impurity such as phosphorus or boron is added is practically used. In addition, even in a so-called intrinsic silicon wafer, impurities that cannot be controlled exist. Therefore, carriers exist in practice in a silicon semiconductor at $1 \times 10^{14}/cm^3$ or more, which contributes to a conduction between the source and the drain. Furthermore, the band gap of a silicon semiconductor is 1.12 eV, and thus the off-state current of a transistor including a silicon semiconductor significantly changes depending on temperature.

Therefore, not by simply using an oxide semiconductor having a wide band gap for a transistor but by purifying the oxide semiconductor such that an impurity other than a main component can be prevented from being contained therein as much as possible so that the carrier concentration becomes less than $1 \times 10^{14}/cm^3$, preferably $1 \times 10^{12}/cm^3$ or less, carriers to be thermally excited at a practical operation temperature can be eliminated, and the transistor can operate only with carriers that are injected from the source side. This makes it possible to decrease the off-state current to $1 \times 10^{-17}$ A or less and to obtain a transistor whose off-state current hardly changes with a change in temperature and which is capable of extremely stable operation.

A technical idea of the present invention is that an impurity is not added to an oxide semiconductor and on the contrary the oxide semiconductor itself is purified by removing an impurity such as water or hydrogen which undesirably exists therein. In other words, a feature of an embodiment of the present invention is that an oxide semiconductor itself is purified by removing water or hydrogen which forms a donor level and further by sufficiently supplying oxygen to eliminate oxygen defects.

In an oxide semiconductor, even shortly after the deposition, hydrogen is observed on the order of $10^{20}/cm^3$ by secondary ion mass spectrometry (SIMS). One technical idea of the present invention is to purify an oxide semiconductor and obtain an electrically i-type (intrinsic) semiconductor by intentionally removing an impurity such as water or hydrogen which forms a donor level and further by adding oxygen (one of components of the oxide semiconductor), which decreases at the same time as removing water or hydrogen, to the oxide semiconductor.

As a result, it is preferable that the amount of hydrogen be as small as possible, and it is also preferable that the number of carriers in the oxide semiconductor be as small as possible. The oxide semiconductor is a purified i-type (intrinsic) semiconductor from which carriers have been eliminated and to which a meaning as a path of carriers as a semiconductor is given, rather than intentionally including carriers as a semiconductor, when used for an insulated-gate transistor.

As a result, by completely eliminating carriers from an oxide semiconductor or significantly reducing carries therein, the off-state current can be decreased in an insulated-gate transistor, which is a technical idea of an embodiment of the present invention. In other words, as a criterion, the hydrogen concentration should be $1 \times 10^{16}/cm^3$ or less and the carrier density should be less than $1 \times 10^{14}/cm^3$, preferably $1 \times 10^{12}/cm^3$ or less. According to a technical idea of the present invention, the ideal hydrogen concentration and carrier concentration are zero or close to zero.

In addition, as a result, the oxide semiconductor functions as a path, and the oxide semiconductor itself is an i-type (intrinsic) semiconductor which is purified so as to include no carriers or extremely few carriers, and carriers are supplied by an electrode on the source side. The degree of supply is determined by the barrier height that is obtained from the electron affinity $\chi$ of the oxide semiconductor, the Fermi level, which ideally corresponds to the intrinsic Fermi level, and the work function of the source or drain electrode.

Therefore, it is preferable that off-state current be as small as possible, and a feature of an embodiment of the present invention is that in characteristics of an insulated-gate transistor to which a drain voltage of 1 V to 10 V is applied, the off-state current is 10 aA/µm (per micrometer in channel width W) or less, preferably 1 aA/µm or less.

(Embodiment 8)

In this embodiment, measured values of off-state current using a test element group (also referred to as a TEG) will be described below.

Figure 14:
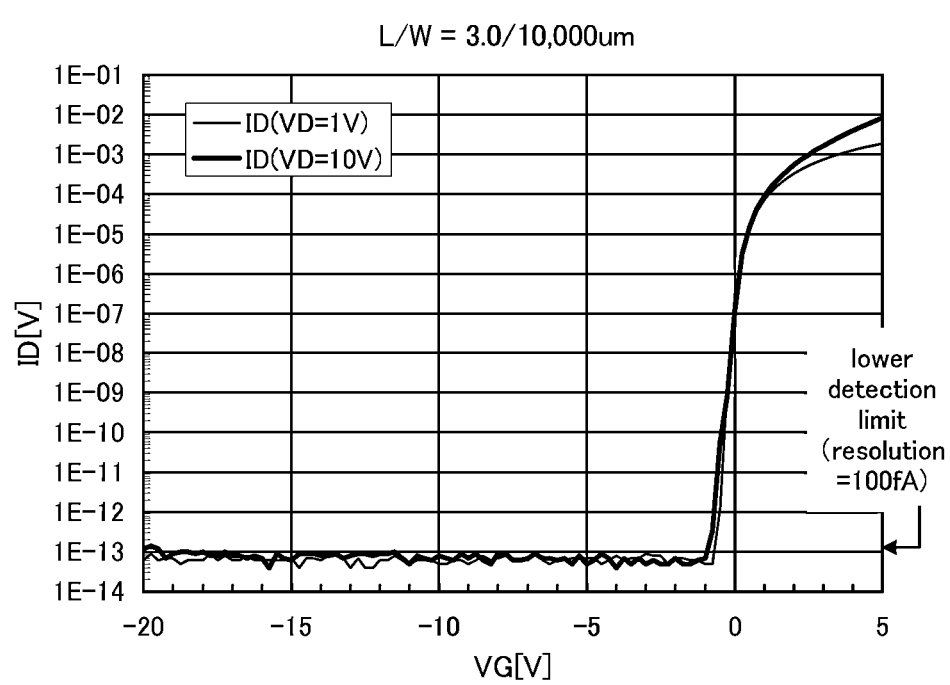
FIG. 14 is a graph for illustrating Embodiment 8.
Figure 15A:
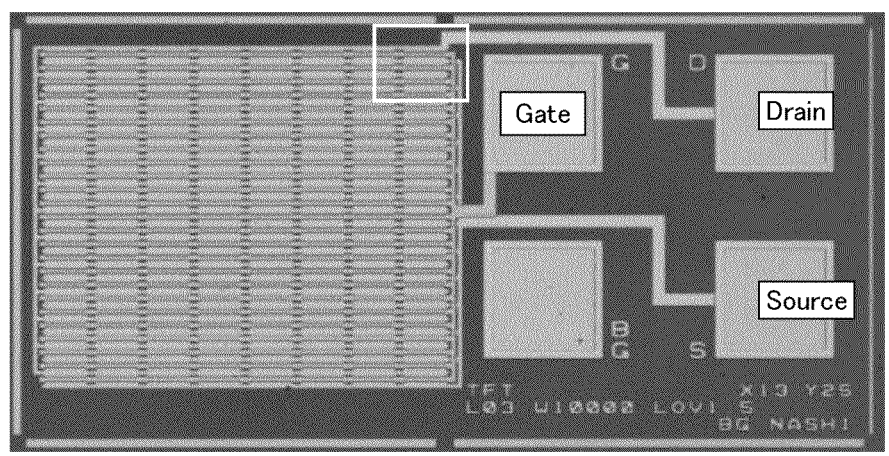
FIGS. 15A and 15B are diagrams for illustrating Embodiment 8.
Figure 15B:
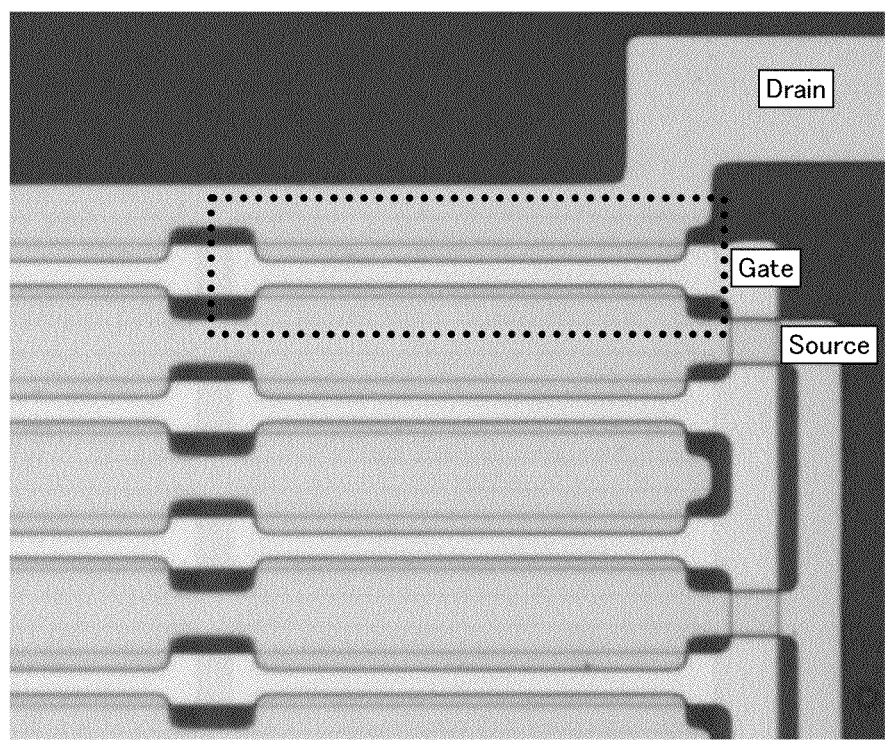

FIG. 14 shows initial characteristics of a thin film transistor with L/W=3 µm/10000 µm in which 200 thin film transistors each with L/W=3 µm/50 µm are connected in parallel. In addition, a top view is shown in FIG. 15A and a partially enlarged top view thereof is show in FIG. 15B. The region enclosed by a dotted line in FIG. 15B is a thin film transistor of one stage with L/W=3 µm/50 µm and Lov=1.5 µm. In order to measure initial characteristics of the thin film transistor, the changing characteristics of the source-drain current (hereinafter referred to as a drain current or Id), i.e., Vg-Id characteristics, were measured, under the conditions where the substrate temperature was set to room temperature, the voltage between source and drain (hereinafter, a drain voltage or Vd) was set to 10 V, and the voltage between source and gate (hereinafter, a gate voltage or Vg) was changed from −20 V to +20 V. Note that FIG. 14 shows Vg in the range of from −20 V to +5 V.

As shown in FIG. 14, the thin film transistor having a channel width W of 10000 µm has an off-state current of $1 \times 10^{-12}$ A or less at Vd of 1 V and 10 V, which is less than or equal to the resolution (100 fA) of a measurement device (a semiconductor parameter analyzer, Agilent 4156C manufactured by Agilent Technologies Inc.).

A method for manufacturing the thin film transistor used for the measurement is described.

First, a silicon nitride layer was formed as a base layer over a glass substrate by a CVD method, and a silicon oxynitride layer was formed over the silicon nitride layer. A tungsten layer was formed as a gate electrode layer over the silicon oxynitride layer by a sputtering method. Here, the gate electrode layer was formed by selectively etching the tungsten layer.

Then, a silicon oxynitride layer having a thickness of 100 nm was formed as a gate insulating layer over the gate electrode layer by a CVD method.

Then, an oxide semiconductor layer having a thickness of 50 nm was formed over the gate insulating layer by a sputtering method using an In—Ga—Zn—O-based oxide semiconductor target (at a molar ratio of $In_2O_3:Ga_2O_3:ZnO=1:1:2$). Here, an island-shaped oxide semiconductor layer was formed by selectively etching the oxide semiconductor layer.

Then, first heat treatment was performed on the oxide semiconductor layer in a nitrogen atmosphere in a clean oven at 450° C. for 1 hour.

Then, a titanium layer (having a thickness of 150 nm) was formed as a source electrode layer and a drain electrode layer over the oxide semiconductor layer by a sputtering method. Here, the source electrode layer and the drain electrode layer were formed by selective etching such that 200 thin film transistors each having a channel length L of 3 µm and a channel width W of 50 µm were connected in parallel to obtain a thin film transistor with L/W=3 µm/10000 µm.

Then, a silicon oxide layer having a thickness of 300 nm was formed as a protective insulating layer in contact with the oxide semiconductor layer by a reactive sputtering method. Here, opening portions were formed in the gate electrode layer, the source electrode layer, and the drain electrode layer by selectively etching the silicon oxide layer which is a protective layer. After that, second heat treatment was performed in a nitrogen atmosphere at 250° C. for 1 hour.

Then, heat treatment was performed at 150° C. for 10 hours before the measurement of Vg-Id characteristics.

Through the above process, a bottom-gate thin film transistor was manufactured.

The reason why the thin film transistor has an off-state current of approximately $1 \times 10^{-12}$ A as shown in FIG. 14 is that the concentration of hydrogen in the oxide semiconductor layer could be sufficiently reduced in the above manufacturing process. The concentration of hydrogen in the oxide semiconductor layer is $1 \times 10^{16}$ atoms/cm$^3$ or less. Note that the concentration of hydrogen in the oxide semiconductor layer was measured by secondary ion mass spectrometry (SIMS).

Although the example of using an In—Ga—Zn—O-based oxide semiconductor is described, this embodiment is not particularly limited thereto. Another oxide semiconductor material, such as an In—Sn—Zn—O-based oxide semiconductor, a Sn—Ga—Zn—O-based oxide semiconductor, an Al—Ga—Zn—O-based oxide semiconductor, a Sn—Al—Zn—O-based oxide semiconductor, an In—Zn—O-based oxide semiconductor, an In—Sn—O-based oxide semiconductor, a Sn—Zn—O-based oxide semiconductor, an Al—Zn—O-based oxide semiconductor, an In—O-based oxide semiconductor, a Sn—O-based oxide semiconductor, or a Zn—O-based oxide semiconductor, can also be used. Furthermore, as an oxide semiconductor material, an In—Al—Zn—O-based oxide semiconductor mixed with $AlO_x$ of 2.5 wt % to 10 wt % or an In—Zn—O-based oxide semiconductor mixed with $SiO_x$ of 2.5 wt % to 10 wt % can be used.

The carrier concentration of the oxide semiconductor layer which is measured by a carrier measurement device is less than the carrier concentration of silicon, $1 \times 10^{14}/cm^3$, preferably $1 \times 10^{12}/cm^3$ or less. In other words, the carrier concentration of the oxide semiconductor layer can be made as close to zero as possible.

The thin film transistor can also have a channel length L of 10 nm to 1000 nm inclusive, which enables an increase in circuit operation speed, and the off-state current is extremely small, which enables a further reduction in power consumption.

In addition, in circuit design, the oxide semiconductor layer can be regarded as an insulator when the thin film transistor is in an off state.

After that, the temperature characteristics of off-state current of the thin film transistor manufactured in this embodiment were evaluated. Temperature characteristics are important in considering the environmental resistance, maintenance of performance, or the like of an end product in which the thin film transistor is used. It is to be understood that a smaller amount of change is more preferable, which increases the degree of freedom for product designing.

For the temperature characteristics, the Vg-Id characteristics were obtained using a constant-temperature chamber under the conditions where substrates provided with thin film transistors were kept at respective constant temperatures of −30° C., 0° C., 25° C., 40° C., 60° C., 80° C., 100° C., and 120° C., the drain voltage was set to 6 V, and the gate voltage was changed from −20 V to +20V.

Figure 16A:
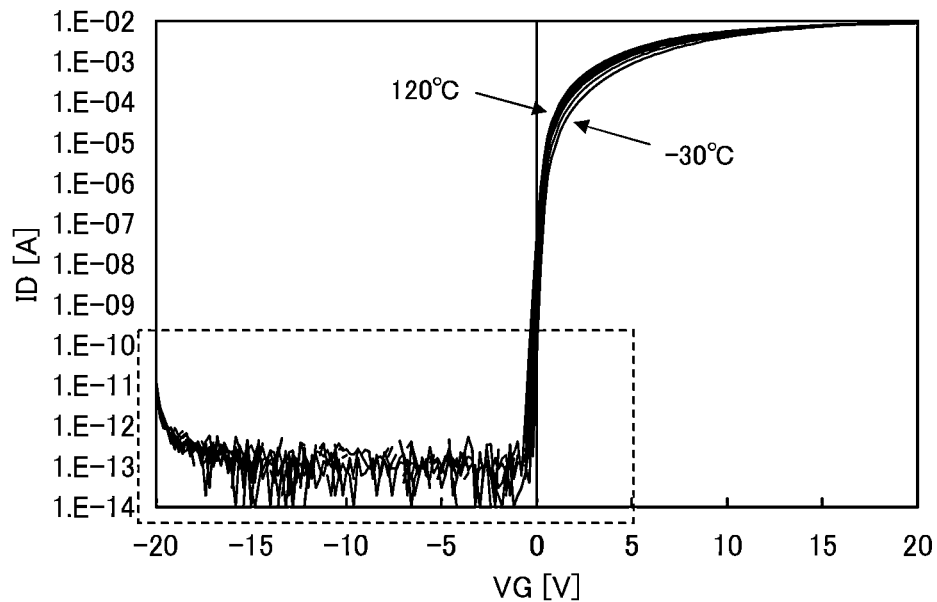
FIGS. 16A and 16B are graphs for illustrating Embodiment 8.
Figure 16B:
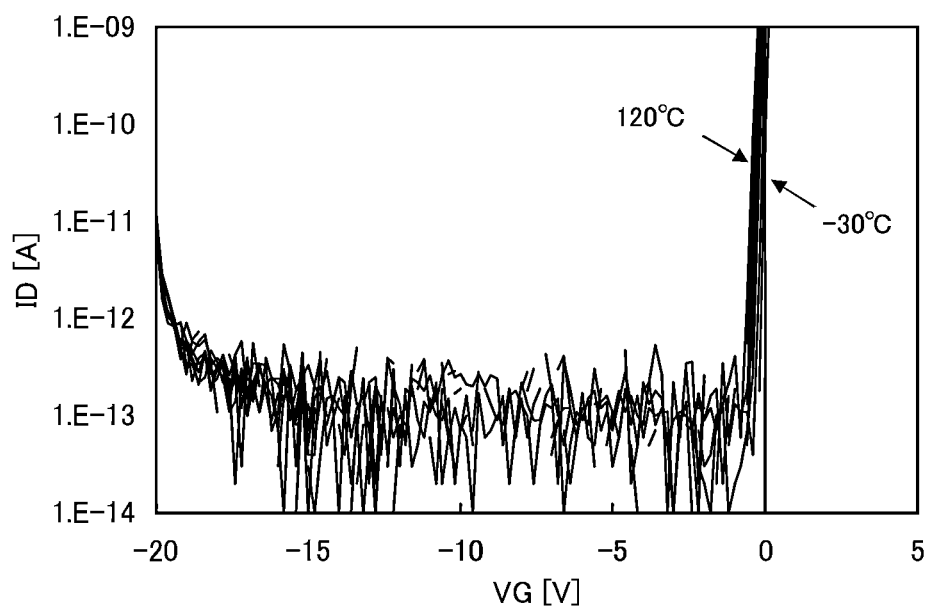

FIG. 16A shows Vg-Id characteristics measured at the above temperatures and superimposed on one another, and FIG. 16B shows an enlarged view of a range of off-state current enclosed by a dotted line in FIG. 16A. The rightmost curve indicated by an arrow in the diagram is a curve obtained at −30° C.; the leftmost curve is a curve obtained at 120° C.; and curves obtained at the other temperatures are located therebetween. The temperature dependence of on-state currents can hardly be observed. On the other hand, as clearly shown also in the enlarged view of FIG. 16B, the off-state currents are less than or equal to $1 \times 10^{-12}$ A, which is near the resolution of the measurement device, at all temperatures except in the vicinity of a gate voltage of −20 V, and the temperature dependence thereof is not observed. In other words, even at a high temperature of 120° C., the off-state current is kept less than or equal to $1\times10^{-12}$ A, and given that the channel width W is 10000 μm, it can be seen that the off-state current is significantly small.

A thin film transistor including a purified oxide semiconductor (purified OS) as described above shows almost no dependence of off-state current on temperature. It can be said that an oxide semiconductor does not show temperature dependence when purified because the conductivity type becomes extremely close to an intrinsic type and the Fermi level is located in the middle of the forbidden band, as illustrated in the band diagram of FIG. 10. This also results from the fact that the oxide semiconductor has an energy gap of 3 eV or more and includes very few thermally excited carriers. In addition, the source region and the drain region are in a degenerated state, which is also a factor for showing no temperature dependence. The thin film transistor mainly operates with carriers which are injected from the degenerated source region to the oxide semiconductor, and the above characteristics (independence of off-state current on temperature) can be explained by independence of carrier density on temperature.

In the case where a memory circuit (memory element) or the like is manufactured using a thin film transistor having such an extremely small off-state current, there is very little leakage. Therefore, an image signal and a common potential can be held for a longer period of time.

This application is based on Japanese Patent Application serial no. 2009-250517 filed with Japan Patent Office on Oct. 30, 2009, and Japanese Patent Application serial no. 2009-279000 filed with Japan Patent Office on Dec. 8, 2009, the entire contents of which are hereby incorporated by reference.

REFERENCE NUMERALS

101: substrate, 102: substrate, 103: pixel circuit, 104: gate line driver circuit, 105: signal line driver circuit, 106: terminal portion, 107: switching transistor, 108: common connection portion, 109: counter electrode, 111: gate line, 112: signal line, 113: pixel, 114: pixel transistor, 115: liquid crystal element, 121: pixel electrode, 122: counter electrode, 123: liquid crystal, 200: substrate, 240: thin film transistor, 241: gate electrode layer, 242: oxide semiconductor layer, 246: oxide insulating layer, 247: conductive layer, 260: thin film transistor, 261: gate electrode layer, 267: pixel electrode, 292: gate insulating layer, 293: protective insulating layer, 294: planarization insulating layer, 295: oxide semiconductor film, 296: oxide semiconductor layer, 301: period, 302: period, 400: substrate, 402: gate insulating layer, 403: protective insulating layer, 404: planarization insulating layer, 410: thin film transistor, 411: gate electrode layer, 413: channel formation region, 416: oxide insulating layer, 417: conductive layer, 420 thin film transistor, 421: gate electrode layer, 423: channel formation region, 427: pixel electrode, 430: oxide semiconductor film, 431: oxide semiconductor layer, 470 thin film transistor, 471: gate electrode layer, 472: oxide semiconductor layer, 480 thin film transistor, 487: pixel electrode, 106A: terminal, 106B: terminal, 1200: signal line driver circuit, 1201: scan line driver circuit, 1202: pixel circuit, 1204: substrate, 1205: sealing material, 1206: alignment film, 1207: alignment film, 1208: connection wiring, 1210: substrate, 1211: pixel transistor, 1214: insulating layer, 1223: driver circuit thin film transistor, 1235: resin layer, 1240: terminal portion, 1241: connection terminal, 1242: connection wiring, 1243: connection terminal, 1250: pixel electrode, 1255: pillar spacer, 1261: switching transistor, 1270: conductive particle, 1280: liquid crystal, 1290: polarizing plate, 1291: counter electrode, 1291: counter electrode, 1293: conductive layer, 1295: polarizing plate, 245a: source electrode layer, 245b: drain electrode layer, 265b: drain electrode layer, 414a: high-resistance source region, 414b: high-resistance drain region, 415a: source electrode layer, 415b: drain electrode layer, 424a: high-resistance source region, 424b: high-resistance drain region, 425a: source electrode layer, 425b: drain electrode layer, 475a: source electrode layer, 475b: drain electrode layer, 485b: drain electrode layer, 9630: housing, 9631: display portion, 9633: speaker, 9635: operation key, 9636: connection terminal, 9638: microphone, 9672: recording medium reading portion, 9676: shutter button, 9677: image receiving portion, 9680: external connecting port, 9681: pointing device.

The invention claimed is:

1. A liquid crystal display device comprising:
   a first substrate provided with:
   a terminal portion including a first connection terminal and a second connection terminal;
   a switching transistor; and
   a pixel circuit including a pixel, the pixel including a pixel transistor and a pixel electrode electrically connected to the pixel transistor;
   a second substrate provided with a counter electrode; and
   a liquid crystal interposed between the pixel electrode and the counter electrode,
   wherein the terminal portion is located outside of the pixel circuit,
   wherein the terminal portion and the second substrate do not overlap each other,
   wherein the counter electrode is electrically connected to one of a source and a drain of the switching transistor,
   wherein each of the pixel transistor and the switching transistor includes an oxide semiconductor layer,
   wherein the other of the source and the drain of the switching transistor is electrically connected to the first connection terminal, and
   wherein a gate of the switching transistor is electrically connected to the second connection terminal.

2. The liquid crystal display device according to claim 1, wherein a gate line driver circuit and a signal line driver circuit are provided over the first substrate.

3. The liquid crystal display device according to claim 1, wherein a hydrogen concentration of the oxide semiconductor layer is $1\times10^{16}/cm^3$ or less.

4. The liquid crystal display device according to claim 1, wherein a carrier concentration of the oxide semiconductor layer is less than $1\times10^{14}/cm^3$.

5. An electronic appliance including the liquid crystal display device according to claim 1.

6. The liquid crystal display device according to claim 1, wherein the oxide semiconductor layer includes an In—Ga—Zn—O based semiconductor.

7. The liquid crystal display device according to claim 1, wherein the oxide semiconductor layer has a thickness of 50 nm or less.

8. The liquid crystal display device according to claim 1, wherein the counter electrode is electrically connected to the switching transistor through a conductive particle.

9. The liquid crystal display device according to claim 8, further comprising:
   a sealing material in contact with and surrounding the liquid crystal; and
   a resin layer in contact with the sealing material,
   wherein the conductive particle is provided in the resin layer.

10. The liquid crystal display device according to claim 1, wherein an off-state current per micrometer of a channel width of each of the pixel transistor and the switching transistor is less than or equal to 10aA/μm.

11. The liquid crystal display device according to claim 1, wherein each of the pixel transistor and the switching transistor has a bottom-gate structure.

12. The liquid crystal display device according to claim 1, wherein a potential of the pixel electrode can be held for 10 seconds or more when the liquid crystal display device displays a still image.

13. A liquid crystal display device comprising:
a first substrate provided with:
  a terminal portion including a first connection terminal and a second connection terminal;
  a switching transistor; and
  a pixel circuit including a pixel, the pixel including a pixel transistor and a pixel electrode electrically connected to the pixel transistor;
a second substrate provided with a counter electrode; and
a liquid crystal interposed between the pixel electrode and the counter electrode,
wherein the terminal portion is located outside of the pixel circuit,
wherein the terminal portion and the second substrate do not overlap each other,
wherein the counter electrode is electrically connected to one of a source and a drain of the switching transistor,
wherein each of the pixel transistor and the switching transistor includes an oxide semiconductor layer,
wherein the other of the source and the drain of the switching transistor is electrically connected to the first connection terminal,
wherein a gate of the switching transistor is electrically connected to the second connection terminal,
wherein a potential of the first connection terminal is a common potential when a potential of the second connection terminal is a potential at which the switching transistor is turned on, and
wherein a supply of the common potential to the first connection terminal is stopped when the potential of the second connection terminal is a potential at which the switching transistor is turned off so that the counter electrode is brought into a floating state.

14. The liquid crystal display device according to claim 13, wherein a gate line driver circuit and a signal line driver circuit are provided over the first substrate.

15. The liquid crystal display device according to claim 13, wherein a hydrogen concentration of the oxide semiconductor layer is $1\times10^{16}$/cm$^3$ or less.

16. The liquid crystal display device according to claim 13, wherein a carrier concentration of the oxide semiconductor layer is less than $1\times10^{14}$/cm$^3$.

17. An electronic appliance including the liquid crystal display device according to claim 13.

18. The liquid crystal display device according to claim 13, wherein the oxide semiconductor layer includes an In—Ga—Zn—O based semiconductor.

19. The liquid crystal display device according to claim 13, wherein the oxide semiconductor layer has a thickness of 50 nm or less.

20. The liquid crystal display device according to claim 13, wherein the counter electrode is electrically connected to the switching transistor through a conductive particle.

21. The liquid crystal display device according to claim 20, further comprising:
a sealing material in contact with and surrounding the liquid crystal; and
a resin layer in contact with the sealing material,
wherein the conductive particle is provided in the resin layer.

22. The liquid crystal display device according to claim 13, wherein an off-state current per micrometer of a channel width of each of the pixel transistor and the switching transistor is less than or equal to 10aA/μm.

23. The liquid crystal display device according to claim 13, wherein each of the pixel transistor and the switching transistor has a bottom-gate structure.

24. The liquid crystal display device according to claim 13, wherein a potential of the pixel electrode can be held for 10 seconds or more when the liquid crystal display device displays a still image.

25. A driving method of a liquid crystal display device, the liquid crystal display device comprising:
a first substrate provided with:
  a terminal portion including a first connection terminal and a second connection terminal;
  a switching transistor including a first oxide semiconductor layer; and
  a pixel circuit including a pixel, the pixel including a pixel transistor including a second oxide semiconductor layer and a pixel electrode electrically connected to the pixel transistor;
a second substrate provided with a counter electrode electrically connected to one of a source and a drain of the switching transistor; and
a liquid crystal interposed between the pixel electrode and the counter electrode,
wherein the terminal portion is located outside of the pixel circuit,
wherein the terminal portion and the second substrate do not overlap each other,
wherein the other of the source and the drain of the switching transistor is electrically connected to the first connection terminal, and
wherein a gate of the switching transistor is electrically connected to the second connection terminal,
the method comprising the steps of:
in a first period where a moving image is displayed, making a first terminal of the switching transistor and a second terminal of the switching transistor into a conduction state so as to supply a common potential to the counter electrode; and
in a second period where a still image is displayed, making the first terminal and the second terminal into a non-conduction state so as to make the counter electrode into an electrically floating state.

26. The driving method of a liquid crystal display device according to claim 25, further comprising:
in the first period, supplying a first signal for driving the pixel transistor from a gate line driver circuit to the pixel transistor and a second signal from a signal line driver circuit to the pixel transistor; and
in the second period, stopping the first signal and the second signal.

27. The driving method of a liquid crystal display device according to claim 25,
wherein a conduction state or a non-conduction state between the counter electrode and the terminal portion to which the common potential is supplied is controlled by the switching transistor in accordance with a signal supplied from the terminal portion to a gate terminal of the switching transistor.

28. The driving method of a liquid crystal display device according to claim 25,
wherein a hydrogen concentration of each of the first oxide semiconductor layer and the second oxide semiconductor layer is $1\times10^{16}/cm^3$ or less.

29. The driving method of a liquid crystal display device according to claim 25,
wherein a carrier concentration of each of the first oxide semiconductor layer and the second oxide semiconductor layer is less than $1\times10^{14}/cm^3$.

30. The driving method of a liquid crystal display device according to claim 25, wherein each of the first oxide semiconductor layer and the second oxide semiconductor layer includes an In—Ga—Zn—O based semiconductor.

31. The driving method of a liquid crystal display device according to claim 25, wherein each of the first oxide semiconductor layer and the second oxide semiconductor layer has a thickness of 50 nm or less.

32. The driving method of a liquid crystal display device according to claim 25,
wherein an off-state current per micrometer of a channel width of each of the pixel transistor and the switching transistor is less than or equal to 10aA/μm.

33. The driving method of a liquid crystal display device according to claim 25,
wherein a potential of the pixel electrode can be held for 10 seconds or more when the liquid crystal display device displays the still image.

* * * * *